United States Patent
Fung et al.

(10) Patent No.: US 10,395,944 B2
(45) Date of Patent: *Aug. 27, 2019

(54) PULSING RF POWER IN ETCH PROCESS TO ENHANCE TUNGSTEN GAPFILL PERFORMANCE

(71) Applicant: Lam Research Corporation, Fremont, CA (US)

(72) Inventors: Waikit Fung, Saratoga, CA (US); Liang Meng, Milpitas, CA (US); Anand Chandrashekar, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/968,605

(22) Filed: May 1, 2018

(65) Prior Publication Data
US 2018/0254195 A1    Sep. 6, 2018

Related U.S. Application Data

(63) Continuation of application No. 15/240,807, filed on Aug. 18, 2016, now Pat. No. 9,978,610.
(Continued)

(51) Int. Cl.
  *H01L 21/44*    (2006.01)
  *H01L 21/3213*  (2006.01)
  (Continued)

(52) U.S. Cl.
  CPC ...... *H01L 21/32136* (2013.01); *C23C 16/045* (2013.01); *C23C 16/505* (2013.01);
  (Continued)

(58) Field of Classification Search
  CPC ......... H01L 21/32136; H01L 21/28568; H01L 21/28556; H01L 21/76877;
  (Continued)

(56) References Cited

U.S. PATENT DOCUMENTS

| 4,713,141 A | 12/1987 | Tsang |
| 4,714,520 A | 12/1987 | Gwozdz |

(Continued)

FOREIGN PATENT DOCUMENTS

| CN | 1552097 A | 12/2004 |
| CN | 1568376 A | 1/2005 |

(Continued)

OTHER PUBLICATIONS

U.S. Notice of Allowance dated Mar. 18, 2015 issued in U.S. Appl. No. 14/285,505.

(Continued)

*Primary Examiner* — Vu A Vu
(74) *Attorney, Agent, or Firm* — Weaver Austin Villenueve & Sampson LLP

(57) ABSTRACT

Methods and apparatuses for filling features with metal materials such as tungsten-containing materials in a substantially void-free manner are provided. In certain embodiments, the method involves depositing an initial layer of a metal such as a tungsten-containing material followed by removing a portion of the initial layer to form a remaining layer, which is differentially passivated along the depth of the high-aspect ratio feature. The portion may be removed by exposing the tungsten-containing material to a plasma generated from a fluorine-containing nitrogen-containing gas and pulsing and/or ramping the plasma during the exposure.

17 Claims, 12 Drawing Sheets

Related U.S. Application Data

(60) Provisional application No. 62/233,186, filed on Sep. 25, 2015, provisional application No. 62/208,527, filed on Aug. 21, 2015.

(51) Int. Cl.
*H01L 21/768* (2006.01)
*H01L 21/67* (2006.01)
*H01L 21/285* (2006.01)
*H01J 37/32* (2006.01)
*C23C 16/505* (2006.01)
*C23C 16/04* (2006.01)

(52) U.S. Cl.
CPC ........ *H01J 37/321* (2013.01); *H01J 37/3244* (2013.01); *H01J 37/32091* (2013.01); *H01J 37/32146* (2013.01); *H01J 37/32449* (2013.01); *H01L 21/28556* (2013.01); *H01L 21/28568* (2013.01); *H01L 21/67069* (2013.01); *H01L 21/76877* (2013.01); *H01J 2237/334* (2013.01)

(58) Field of Classification Search
CPC . H01L 21/67069; C23C 16/505; C23C 16/52; H01J 37/3244; H01J 37/32091; H01J 37/321; H01J 2237/334
USPC ........................................................ 438/669
See application file for complete search history.

(56) References Cited

U.S. PATENT DOCUMENTS

| | | |
|---|---|---|
| 4,804,560 A | 2/1989 | Shioya et al. |
| 4,874,723 A | 10/1989 | Jucha et al. |
| 4,891,550 A | 1/1990 | Northrop et al. |
| 4,988,644 A | 1/1991 | Jucha et al. |
| 4,997,520 A | 3/1991 | Jucha et al. |
| 5,037,775 A | 8/1991 | Reisman |
| 5,147,500 A | 9/1992 | Tachi et al. |
| 5,164,330 A | 11/1992 | Davis et al. |
| 5,431,774 A | 7/1995 | Douglas |
| 5,489,552 A | 2/1996 | Merchant et al. |
| 5,719,410 A | 2/1998 | Suehiro et al. |
| 5,747,379 A | 5/1998 | Huang et al. |
| 5,767,015 A | 6/1998 | Tabara |
| 5,785,796 A | 7/1998 | Lee |
| 5,807,786 A | 9/1998 | Chang |
| 5,833,817 A | 11/1998 | Tsai et al. |
| 5,861,671 A | 1/1999 | Tsai et al. |
| 5,866,483 A | 2/1999 | Shiau et al. |
| 5,893,758 A | 4/1999 | Sandhu et al. |
| 5,914,277 A | 6/1999 | Shinohara |
| 5,963,833 A | 10/1999 | Thakur |
| 5,990,020 A | 11/1999 | Ha |
| 6,011,311 A | 1/2000 | Hsing et al. |
| 6,030,881 A | 2/2000 | Papasouliotis et al. |
| 6,100,193 A | 8/2000 | Suehiro et al. |
| 6,110,822 A | 8/2000 | Huang et al. |
| 6,184,158 B1 | 2/2001 | Shufflebotham et al. |
| 6,221,754 B1 | 4/2001 | Chiou et al. |
| 6,245,654 B1 | 6/2001 | Shih et al. |
| 6,376,376 B1 | 4/2002 | Lim et al. |
| 6,383,910 B2 | 5/2002 | Okada et al. |
| 6,432,830 B1 | 8/2002 | Merry |
| 6,436,809 B1 | 8/2002 | Kwag et al. |
| 6,503,843 B1 | 1/2003 | Xia et al. |
| 6,593,233 B1 | 7/2003 | Miyazaki et al. |
| 6,607,985 B1 | 8/2003 | Kraft et al. |
| 6,635,965 B1 | 10/2003 | Lee et al. |
| 6,683,000 B2 | 1/2004 | Fukui et al. |
| 6,696,337 B2 | 2/2004 | Asano et al. |
| 6,828,226 B1 | 12/2004 | Chen et al. |
| 6,844,258 B1 | 1/2005 | Fair et al. |
| 6,872,323 B1 | 3/2005 | Entley et al. |
| 7,005,372 B2 | 2/2006 | Levy et al. |
| 7,026,246 B2 | 4/2006 | Yun |
| 7,115,516 B2 | 10/2006 | Chen et al. |
| 7,141,494 B2 | 11/2006 | Lee et al. |
| 7,193,369 B2 | 3/2007 | Min et al. |
| 7,427,568 B2 | 9/2008 | Chen et al. |
| 7,504,725 B2 | 3/2009 | Kim et al. |
| 7,578,944 B2 | 8/2009 | Min et al. |
| 7,589,017 B2 | 9/2009 | Chan et al. |
| 7,655,567 B1 | 2/2010 | Gao et al. |
| 7,772,114 B2 | 8/2010 | Chan et al. |
| 7,772,121 B2 | 8/2010 | Chen et al. |
| 7,955,972 B2 | 6/2011 | Chan et al. |
| 7,964,504 B1 | 6/2011 | Shaviv et al. |
| 7,993,460 B2 | 8/2011 | Steger |
| 8,058,170 B2 | 11/2011 | Chandrashekar et al. |
| 8,071,478 B2 | 12/2011 | Wu et al. |
| 8,119,527 B1 | 2/2012 | Chandrashekar et al. |
| 8,124,531 B2 | 2/2012 | Chandrashekar et al. |
| 8,129,270 B1 | 3/2012 | Chandrashekar et al. |
| 8,153,520 B1 | 4/2012 | Chandrashekar et al. |
| 8,262,800 B1 | 9/2012 | Wongsenakhum et al. |
| 8,399,351 B2 | 3/2013 | Takahashi |
| 8,409,985 B2 | 4/2013 | Chan et al. |
| 8,435,894 B2 | 5/2013 | Chandrashekar et al. |
| 8,501,620 B2 | 8/2013 | Chandrashekar et al. |
| 8,551,885 B2 | 10/2013 | Chen et al. |
| 8,747,960 B2 | 6/2014 | Dordi et al. |
| 8,835,317 B2 | 9/2014 | Chandrashekar et al. |
| 8,883,637 B2 | 11/2014 | Jeng et al. |
| 9,034,768 B2 | 5/2015 | Chandrashekar et al. |
| 9,082,826 B2 | 7/2015 | Chandrashekar et al. |
| 9,190,293 B2 | 11/2015 | Wang et al. |
| 9,240,347 B2 | 1/2016 | Chandrashekar et al. |
| 9,299,575 B2 | 3/2016 | Park et al. |
| 9,548,228 B2 | 1/2017 | Chandrashekar et al. |
| 9,589,835 B2 | 3/2017 | Chandrashekar et al. |
| 9,653,353 B2 | 5/2017 | Chandrashekar et al. |
| 9,972,504 B2 | 5/2018 | Lai et al. |
| 9,978,610 B2 * | 5/2018 | Fung ................ H01L 21/32136 |
| 2002/0132472 A1 | 9/2002 | Park |
| 2002/0177325 A1 | 11/2002 | Takewaka et al. |
| 2003/0017701 A1 | 1/2003 | Nakahara et al. |
| 2003/0082902 A1 | 5/2003 | Fukui et al. |
| 2003/0109145 A1 | 6/2003 | Yun |
| 2003/0190802 A1 | 10/2003 | Wang et al. |
| 2003/0235995 A1 | 12/2003 | Oluseyi et al. |
| 2004/0025091 A1 | 2/2004 | Totman et al. |
| 2004/0077161 A1 | 4/2004 | Chen et al. |
| 2004/0079632 A1 | 4/2004 | Ahmad et al. |
| 2004/0142557 A1 | 7/2004 | Levy et al. |
| 2004/0245091 A1 | 12/2004 | Karim et al. |
| 2004/0266174 A1 | 12/2004 | Yang et al. |
| 2005/0006222 A1 | 1/2005 | Ding et al. |
| 2005/0031786 A1 | 2/2005 | Lee et al. |
| 2005/0042829 A1 | 2/2005 | Kim et al. |
| 2005/0250316 A1 | 11/2005 | Choi et al. |
| 2005/0275941 A1 | 12/2005 | Liu et al. |
| 2006/0084269 A1 | 4/2006 | Min et al. |
| 2006/0094238 A1 | 5/2006 | Levy et al. |
| 2006/0214244 A1 | 9/2006 | Minakata |
| 2007/0006893 A1 | 1/2007 | Ji |
| 2007/0187362 A1 | 8/2007 | Nakagawa et al. |
| 2007/0264105 A1 | 11/2007 | Pharand et al. |
| 2007/0298585 A1 | 12/2007 | Lubomirsky et al. |
| 2008/0054468 A1 | 3/2008 | Choi et al. |
| 2008/0054472 A1 | 3/2008 | Shinriki et al. |
| 2008/0254623 A1 | 10/2008 | Chan et al. |
| 2008/0318417 A1 | 12/2008 | Shinriki et al. |
| 2009/0053893 A1 | 2/2009 | Khandelwal et al. |
| 2009/0163025 A1 | 6/2009 | Humayun et al. |
| 2009/0286381 A1 | 11/2009 | van Schravendijk et al. |
| 2010/0072623 A1 | 3/2010 | Prindle et al. |
| 2010/0130002 A1 | 5/2010 | Dao et al. |
| 2010/0144140 A1 | 6/2010 | Chandrashekar et al. |
| 2010/0159694 A1 | 6/2010 | Chandrashekar et al. |
| 2010/0240212 A1 | 9/2010 | Takahashi |
| 2010/0267235 A1 | 10/2010 | Chen et al. |

(56) References Cited

U.S. PATENT DOCUMENTS

| | | | |
|---|---|---|---|
| 2011/0151674 A1* | 6/2011 | Tang | H01J 37/32357 438/715 |
| 2011/0159690 A1 | 6/2011 | Chandrashekar et al. | |
| 2011/0212274 A1 | 9/2011 | Selsley | |
| 2011/0233778 A1 | 9/2011 | Lee et al. | |
| 2012/0009785 A1 | 1/2012 | Chandrashekar et al. | |
| 2012/0077342 A1 | 3/2012 | Gao et al. | |
| 2012/0115329 A1 | 5/2012 | Chandrashekar et al. | |
| 2012/0164832 A1 | 6/2012 | Chandrashekar et al. | |
| 2013/0062677 A1 | 3/2013 | Li et al. | |
| 2013/0105303 A1 | 5/2013 | Lubomirsky et al. | |
| 2013/0168354 A1 | 7/2013 | Kanarik | |
| 2013/0260555 A1* | 10/2013 | Zope | H01L 21/4846 438/660 |
| 2013/0302980 A1 | 11/2013 | Chandrashekar et al. | |
| 2013/0330926 A1 | 12/2013 | Chandrashekar et al. | |
| 2014/0017891 A1 | 1/2014 | Chandrashekar et al. | |
| 2014/0120727 A1 | 5/2014 | Subramanian et al. | |
| 2014/0231896 A1 | 8/2014 | Matsumori et al. | |
| 2014/0273451 A1 | 9/2014 | Wang et al. | |
| 2014/0349477 A1* | 11/2014 | Chandrashekar | H01L 21/76877 438/627 |
| 2015/0024592 A1 | 1/2015 | Chandrashekar et al. | |
| 2015/0056803 A1 | 2/2015 | Chandrashekar et al. | |
| 2015/0111374 A1 | 4/2015 | Bao et al. | |
| 2015/0170935 A1 | 6/2015 | Wang et al. | |
| 2015/0262829 A1 | 9/2015 | Park et al. | |
| 2016/0020152 A1 | 1/2016 | Posseme | |
| 2016/0118256 A1 | 4/2016 | Rastogi et al. | |
| 2016/0190008 A1 | 6/2016 | Chandrashekar et al. | |
| 2016/0293467 A1 | 10/2016 | Caveney et al. | |
| 2017/0040214 A1 | 2/2017 | Lai et al. | |
| 2017/0053811 A1 | 2/2017 | Fung et al. | |
| 2018/0061663 A1 | 3/2018 | Chandrashekar et al. | |
| 2018/0240682 A1 | 8/2018 | Lai et al. | |

FOREIGN PATENT DOCUMENTS

| | | |
|---|---|---|
| CN | 103125013 A | 5/2013 |
| EP | 1 055 746 | 11/2000 |
| JP | H2-187031 A | 7/1990 |
| JP | H04-56130 | 2/1992 |
| JP | H4-142061 A | 5/1992 |
| JP | H5-226280 A | 9/1993 |
| JP | H07-094488 | 4/1995 |
| JP | H7-147321 A | 6/1995 |
| JP | H07-226393 | 8/1995 |
| JP | 08-031935 A | 2/1996 |
| JP | H09-326436 | 12/1997 |
| JP | H10-144688 A | 5/1998 |
| JP | H10-178014 A | 6/1998 |
| JP | H10-256187 A | 9/1998 |
| JP | 2001-007048 | 1/2001 |
| JP | 2001-274114 | 10/2001 |
| JP | 2002-009017 | 1/2002 |
| JP | 2002-16066 A | 1/2002 |
| JP | 2002-016066 A | 1/2002 |
| JP | 2002-305162 | 10/2002 |
| JP | 2003-007677 | 1/2003 |
| JP | 2003-142484 | 5/2003 |
| JP | 2006-278496 | 10/2006 |
| JP | 2007-251164 | 9/2007 |
| JP | 2008-000742 | 1/2008 |
| JP | 2008-057042 | 3/2008 |
| JP | 2010-153852 A | 7/2010 |
| JP | 2010-225697 | 10/2010 |
| JP | 2010-251760 A | 11/2010 |
| JP | 2011-035366 A | 2/2011 |
| JP | 2011-054969 A | 3/2011 |
| JP | 2012-151187 A | 8/2012 |
| JP | 2013-032575 A | 2/2013 |
| JP | 2015-512568 A | 4/2015 |
| KR | 10-2001-0030488 | 4/2001 |
| KR | 10-2003-0035877 | 5/2003 |
| KR | 10-2003-0058853 | 7/2003 |
| KR | 10-2004-0087406 | 10/2004 |
| KR | 10-2005-0011479 | 1/2005 |
| KR | 10-2005-0013187 | 2/2005 |
| KR | 10-2006-0087844 | 8/2006 |
| KR | 10-2007-0054100 | 5/2007 |
| KR | 10-2010-0067065 | 6/2010 |
| KR | 10-1201074 B1 | 11/2012 |
| TW | 557503 | 10/2003 |
| WO | WO 99/67056 | 12/1999 |
| WO | WO 2007/023950 A1 | 3/2007 |
| WO | WO 2013/148880 | 10/2013 |

OTHER PUBLICATIONS

U.S. Notice of Allowance dated May 14, 2015 issued in U.S. Appl. No. 14/285,505.

U.S. Office Action dated Sep. 16, 2015 issued in U.S. Appl. No. 14/341,646.

U.S. Office Action dated Apr. 8, 2016 issued in U.S. Appl. No. 14/341,646.

U.S. Notice of Allowance dated Sep. 9, 2016 issued in U.S. Appl. No. 14/341,646.

U.S. Office Action dated Jul. 1, 2016 issued in U.S. Appl. No. 14/830,683.

U.S. Final Office Action dated Feb. 7, 2017 issued in U.S. Appl. No. 14/830,683.

U.S. Office Action dated Jul. 25, 2017 issued in U.S. Appl. No. 14/830,683.

U.S. Notice of Allowance dated Jan. 11, 2018 in U.S. Appl. No. 14/830,683.

U.S. Office Action dated Apr. 13, 2017 issued in U.S. Appl. No. 15/240,807.

U.S. Final Office Action dated Aug. 31, 2017 issued in U.S. Appl. No. 15/240,807.

U.S. Notice of Allowance dated Jan. 23, 2018 issued in U.S. Appl. No. 15/240,807.

U.S. Office Action dated Dec. 30, 2009 issued in U.S. Appl. No. 12/332,017.

U.S. Final Office Action dated Jul. 26, 2010 issued in U.S. Appl. No. 12/332,017.

U.S. Office Action dated Nov. 15, 2010 issued in U.S. Appl. No. 12/332,017.

U.S. Final Office Action dated Jul. 22, 2011 issued in U.S. Appl. No. 12/332,017.

U.S. Notice of Allowance dated Oct. 28, 2011 issued in U.S. Appl. No. 12/332,017.

U.S. Office Action dated Nov. 1, 2010 issued in U.S. Appl. No. 12/535,377.

U.S. Office Action dated Jun. 14, 2011 issued in U.S. Appl. No. 12/535,377.

U.S. Final Office Action dated Dec. 1, 2011 issued in U.S. Appl. No. 12/535,377.

U.S. Office Action dated Mar. 7, 2013 issued in U.S. Appl. No. 12/535,377.

U.S. Final Office Action dated Oct. 7, 2013 issued in U.S. Appl. No. 12/535,377.

U.S. Examiner's Answer to Appeal Brief dated Apr. 17, 2015 issued in U.S. Appl. No. 12/535,377.

U.S. Office Action dated Oct. 9, 2015 issued in U.S. Appl. No. 12/535,377.

U.S. Final Office Action dated May 5, 2016 issued in U.S. Appl. No. 12/535,377.

U.S. Office Action dated Nov. 23, 2012 issued in U.S. Appl. No. 13/412,534.

U.S. Notice of Allowance dated Apr. 8, 2013, issued in U.S. Appl. No. 13/412,534.

U.S. Office Action dated Apr. 11, 2014 issued in U.S. Appl. No. 13/934,089.

U.S. Office Action dated Nov. 12, 2014 issued in U.S. Appl. No. 13/934,089.

(56) References Cited

OTHER PUBLICATIONS

U.S. Office Action dated Jul. 8, 2015 issued in U.S. Appl. No. 13/934,089.
U.S. Final Office Action dated Dec. 31, 2015 issued in U.S. Appl. No. 13/934,089.
U.S. Office Action dated Jun. 1, 2016 issued in U.S. Appl. No. 13/934,089.
U.S. Notice of Allowance dated Oct. 21, 2016 issued in U.S. Appl. No. 13/934,089.
U.S. Office Action dated Sep. 13, 2010 issued in U.S. Appl. No. 12/535,464.
U.S. Final Office Action dated Apr. 14, 2011 issued in U.S. Appl. No. 12/535,464.
U.S. Office Action dated Jul. 28, 2011 issued in U.S. Appl. No. 12/535,464.
U.S. Office Action dated Oct. 12, 2011 issued in U.S. Appl. No. 12/535,464.
U.S. Notice of Allowance dated Dec. 30, 2011 issued in U.S. Appl. No. 12/535,464.
U.S. Office Action dated Sep. 2, 2011 issued in U.S. Appl. No. 12/534,566.
U.S. Notice of Allowance dated Dec. 20, 2011 issued in U.S. Appl. No. 12/534,566.
U.S. Office Action dated Mar. 13, 2012 issued in U.S. Appl. No. 12/833,823.
U.S. Final Office Action dated Dec. 21, 2012 issued in U.S. Appl. No. 12/833,823.
U.S. Office Action dated Sep. 9, 2013 issued in U.S. Appl. No. 12/833,823.
U.S. Final Office Action dated Apr. 1, 2014 issued in U.S. Appl. No. 12/833,823.
U.S. Notice of Allowance dated Jan. 14, 2015 issued in U.S. Appl. No. 12/833,823.
U.S. Office Action dated Nov. 25, 2011 issued in U.S. Appl. No. 13/016,656.
U.S. Notice of Allowance dated Jan. 9, 2012 issued in U.S. Appl. No. 13/016,656.
U.S. Office Action dated Mar. 27, 2012 issued in U.S. Appl. No. 13/351,970.
U.S. Final Office Action dated Sep. 11, 2012 issued in U.S. Appl. No. 13/351,970.
U.S. Notice of Allowance dated Jan. 9, 2013 issued in U.S. Appl. No. 13/351,970.
U.S. Office Action dated Jan. 6, 2014 issued in U.S. Appl. No. 13/888,077.
U.S. Notice of Allowance, dated May 12, 2014 issued in U.S. Appl. No. 13/888,077.
U.S. Office Action, dated Dec. 23, 2014, issued in U.S. Appl. No. 13/851,885.
U.S. Notice of Allowance, dated Aug. 3, 2016, issued in U.S. Appl. No. 13/851,885.
U.S. Notice of Allowance, dated Dec. 14, 2016, issued in U.S. Appl. No. 13/851,885.
U.S. Notice of Allowance, dated Mar. 24, 2017, issued in U.S. Appl. No. 13/851,885.
U.S. Office Action dated Dec. 18, 2014 issued in U.S. Appl. No. 14/502,817.
U.S. Final Office Action dated Jul. 17, 2015 issued in U.S. Appl. No. 14/502,817.
U.S. Notice of Allowance dated Sep. 25, 2015 issued in U.S. Appl. No. 14/502,817.
U.S. Office Action dated Sep. 2, 2016 issued in U.S. Appl. No. 14/965,806.
U.S. Final Office Action dated Apr. 14, 2017 issued in U.S. Appl. No. 14/965,806.
U.S. Office Action, dated Sep. 11, 2017, issued in U.S. Appl. No. 14/965,806.
Taiwan Office Action dated Nov. 7, 2017 issued in Application No. TW 103125515.
Japanese Notification of Reasons for Refusal dated Apr. 10, 2018 issued in Application No. JP 2014-150275.
Japanese Office Action dated Mar. 11, 2014 issued in Application No. JP 2009-278990.
Japanese Final Office Action dated Mar. 17, 2015 issued in Application No. JP 2009-278990.
Korean Office Action dated Aug. 8, 2011 issued in Application No. KR 10-2009-0122292.
Korean Office Action dated Jun. 26, 2012 issued in Application No. KR 10-2009-0122292.
Korean Office Action dated Nov. 6, 2012 issued in Application No. KR 2012-0104518.
Taiwan Office Action dated Mar. 27, 2014 issued in Application No. TW 098142115.
Taiwan Office Action [Decision] dated Oct. 13, 2014 issued in Application No. TW 098142115.
Taiwan Office Action after Re-examination dated Mar. 14, 2017 issued in Application No. TW 098142115.
Japanese Office Action dated Feb. 25, 2014 issued in Application No. JP 2009-292610.
Japanese Office Action dated Feb. 10, 2015 issued in Application No. JP 2009-292610.
Japanese Office Action (Examiner's Report to the Appeal Board of the Japan Office) dated Sep. 1, 2015 issued in Application No. JP 2009-292610.
Japanese Appeal Decision dated Nov. 1, 2016 issued in Application No. JP 2009-292610.
Korean Office Action dated Sep. 12, 2012 issued in Application No. KR 2012-0104518.
Taiwan Office Action dated Apr. 29, 2014, issued in Application No. TW 098146010.
Singapore Examination and Search Report dated Dec. 14, 2011 issued in Application No. SG 201005237-1.
Singapore Written Examination Report and Search Report dated Jun. 30, 2015 issued in Application No. SG 201303450-9.
Singapore Search and Examination Report dated Jan. 26, 2016 issued in Application No. SG 201303450-9.
Korean Provisional Rejection dated Nov. 16, 2012, issued in Application No. KR 2011-0068603.
Korean Office Action dated Sep. 26, 2016, issued in Application No. KR 10-2013-0054726.
Korean Final Office Action dated May 30, 2017, issued in Application No. KR 10-2013-0054726.
Korean Final Office Action dated Sep. 19, 2017, issued in Application No. KR 10-2013-0054726.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Chinese First Office Action dated Mar. 18, 2016 issued in Application No. CN 201380022693.8.
Chinese Second Office Action dated Jan. 23, 2017 issued in Application No. CN 201380022693.8.
Chinese Third Office Action dated Sep. 25, 2017 issued in Application No. CN 201380022693.8.
Chinese Fourth Office Action dated Mar. 15, 2018 issued in Application No. CN 201380022693.8.
Japanese Notification of Reasons for Rejection dated Dec. 20, 2016 issued in Application No. JP 2015-503547.
Taiwan Office Action dated Oct. 25, 2016 issued in Application No. TW 102110947.
Japanese Notification of Reasons for Refusal dated Mar. 20, 2018 issued in Application No. JP 2014-107102.
Carver et al., (Feb. 20, 2015) "Atomic Layer Etching: An Industry Perspective," *ECS Journal of Solid State Science and Technology*, 4(6):N5005-N5009.
Chen et al., (Aug. 2003) "Advances in Remote Plasma Sources for Cleaning 300 mm and Flat Panel CVD Systems," *Semiconductor Magazine*, 6 pp.
Deposition Process, Oxford Electronics, 1996, 1 page.
Dimensions of Wafer as described by Wikepedia, 2008, 1 page.

(56) References Cited

OTHER PUBLICATIONS

Faraz et al., (Mar. 24, 2015) "Atomic Layer Etching: What Can We Learn from Atomic Layer Deposition?," *ECS Journal of Solid State Science and Technology*, 4(6):N5023-N5032.
Rosner et al., (1971) "Kinetics of the attack of refractory solids by atomic and molecular fluorine," *The Journal of Physical Chemistry*, 75(3):308-317.
Tsang, C.K. et al., "CMOS-Compatible Through Silicon Vias for 3D Process Integration", Materials Research Society 2007 Symposium Proceedings vol. 970, paper 0970-Y01-01.
U.S. Office Action dated Jan. 7, 2019 issued in U.S. Appl. No. 15/687,775.
Chinese First Office Action dated Aug. 28, 2018 issued in Application No. CN 201610643282.6.
Chinese Fifth Office Action dated Aug. 24, 2018 issued in Application No. CN 201380022693.8.

* cited by examiner

PULSING RF POWER IN ETCH PROCESS TO ENHANCE TUNGSTEN GAPFILL PERFORMANCE

CROSS-REFERENCE TO RELATED APPLICATION

This application is a continuation of U.S. application Ser. No. 15/240,807, filed Aug. 18, 2016, titled "PULSING RF POWER IN ETCH PROCESS TO ENHANCE TUNGSTEN GAPFILL PERFORMANCE," which claims benefit of U.S. Provisional Patent Application No. 62/208,527, filed Aug. 21, 2015, and titled "PULSING RF POWER IN ETCH PROCESS TO ENHANCE TUNGSTEN GAPFILL PERFORMANCE," and U.S. Provisional Patent Application No. 62/233,186, filed Sep. 25, 2015, and titled "PULSING RF POWER IN ETCH PROCESS TO ENHANCE TUNGSTEN GAPFILL PERFORMANCE," which are incorporated by reference herein in their entireties and for all purposes.

BACKGROUND

Deposition of tungsten-containing materials using chemical vapor deposition (CVD) techniques is an integral part of many semiconductor fabrication processes. These materials may be used for horizontal interconnects, vias between adjacent metal layers, contacts between first metal layers and devices on the silicon substrate, and high aspect ratio features. In a conventional deposition process, a substrate is heated to a predetermined process temperature in a deposition chamber, and a thin layer of tungsten-containing materials that serves as a seed or nucleation layer is deposited. Thereafter, the remainder of the tungsten-containing material (the bulk layer) is deposited on the nucleation layer. Conventionally, the tungsten-containing materials are formed by the reduction of tungsten hexafluoride ($WF_6$) with hydrogen ($H_2$). Tungsten-containing materials are deposited over an entire exposed surface area of the substrate including features and a field region.

Depositing tungsten-containing materials into small and, especially, high aspect ratio features may cause formation of seams (e.g., unfilled voids) inside the filled features. Large seams may lead to high resistance, contamination, loss of filled materials, and otherwise degrade performance of integrated circuits. For example, a seam may extend close to the field region after filling process and then open during chemical-mechanical planarization.

SUMMARY

Methods and apparatuses for processing semiconductor substrates are provided herein. One aspect involves a method including: providing a substrate having a feature partially filled with a metal; exposing the substrate to a fluorine- and nitrogen-based plasma; and pulsing the plasma to remove a portion of the metal.

In some embodiments, the metal is tungsten. In various embodiments, the plasma is pulsed between an ON state and an OFF state, whereby the plasma power during the OFF state is 0 W and the plasma power during the ON state is between about 50 W and about 3000 W. In some embodiments, the plasma is pulsed at a frequency between about 1 Hz and about 400 kHz, or a frequency between about 1 Hz and about 100 kHz. In various embodiments, the plasma is pulsed using a duty cycle between about 1% and about 99%, or a duty cycle between about 10% and about 90%. In some embodiments, the plasma is pulsed between an ON state and an OFF state, and the plasma is in the ON state for a duration between about 100 milliseconds and about 10 seconds in each pulse. In various embodiments, exposing the substrate to the fluorine- and nitrogen-based plasma includes flowing a fluorine- and nitrogen-containing gas and igniting a plasma.

In various embodiments, the fluorine- and nitrogen-containing gas flow is pulsed. The fluorine- and nitrogen-containing gas flow may be pulsed using a duty cycle between about 30% and about 70%. In some embodiments, the fluorine- and nitrogen-containing gas flow is pulsed for a duration between about 200 ms and about 3 seconds, or between about 0.5 seconds and about 3 seconds. In some embodiments, the fluorine- and nitrogen-containing gas is nitrogen trifluoride.

The method may further include, after removing the portion of the metal, exposing the substrate to a metal-containing precursor to deposit the metal in the feature.

Another aspect involves a method including: providing a substrate having a feature partially filled with tungsten to a process chamber; introducing a fluorine- and nitrogen-containing gas to the process chamber; pulsing flow of the fluorine- and nitrogen-containing gas; and igniting a plasma in the process chamber to generate a fluorine- and nitrogen-based plasma to etch a portion of the tungsten.

In some embodiments, the fluorine- and nitrogen-containing gas flow is pulsed using a duty cycle between about 30% and about 70%. In various embodiments, the fluorine- and nitrogen-containing gas flow is pulsed for a duration between about 200 ms and about 3 seconds, or between about 0.5 seconds and about 3 seconds. In various embodiments, the fluorine- and nitrogen-containing gas is nitrogen trifluoride.

In various embodiments, the plasma is pulsed. The plasma may be pulsed between an ON state and an OFF state, wherein the plasma power during the OFF state is 0 W and the plasma power during the ON state is between about 50 W and about 3000 W. In various embodiments, the plasma is pulsed at a frequency between about 1 Hz and about 400 kHz, or between about 1 Hz and about 100 kHz.

Another aspect involves an apparatus of processing semiconductor substrates, the apparatus including: a process chamber including a dome, a showerhead, and a pedestal; one or more gas inlets into the process chamber and associated flow-control hardware; a radio frequency (RF) generator; and a controller having at least one processor and a memory, whereby the at least one processer and the memory are communicatively connected with one another, the at least one processor is at least operatively connected with the flow-control hardware and RF generator, and the memory stores computer-executable instructions for: introducing a fluorine- and nitrogen-containing gas to the process chamber, igniting a plasma, and pulsing the plasma between an ON state and an OFF state, wherein the plasma power during the OFF state is 0 W and the plasma power during the ON state is between about 50 W and about 3000 W. In various embodiments, flow of the fluorine- and nitrogen-containing gas is pulsed. In some embodiments, the fluorine- and nitrogen-containing gas flow is pulsed using a duty cycle between about 30% and about 70%. In various embodiments, the fluorine- and nitrogen-containing gas flow is pulsed for a duration between about 200 ms and about 3 seconds, or between about 0.5 seconds and about 3 seconds. In various embodiments, the fluorine- and nitrogen-containing gas is nitrogen trifluoride.

These and other aspects of the disclosed embodiments are further described in more detail with reference to the corresponding drawings.

DETAILED DESCRIPTION

In the following description, numerous specific details are set forth in order to provide a thorough understanding of the disclosed embodiments. The disclosed embodiments may be practiced without some or all of these specific details. In other instances, well known process operations have not been described in detail to not unnecessarily obscure the disclosed embodiments. While the disclosed embodiments will be described in conjunction with the specific embodiments, it will be understood that it is not intended to limit the disclosed embodiments.

Introduction

Disclosed embodiments involve pulsing radio frequency power in an etch process to enhance tungsten gapfill performance. Example methods for which disclosed embodiments may be used are described below with respect to FIGS. 1-9.

Filling features with tungsten-containing materials may cause formation of seams inside the filled features. A seam can form when a layer that is being deposited on the side walls of the feature thickens to the point that it seals off (i.e., forms a pinch point, also referred to as a sealing point) a void space below this point from the environment of the processing chamber. In the other words, thickening of the deposited layer pinches off a void space. This pinching prevents precursors and/or other reactants from entering remaining void spaces, and they remain unfilled. A void space is typically an elongated seam extending throughout a portion of the filled feature along the feature's depth direction. This void space or seam is also sometimes referred to as a keyhole because of its shape.

Figure 1:
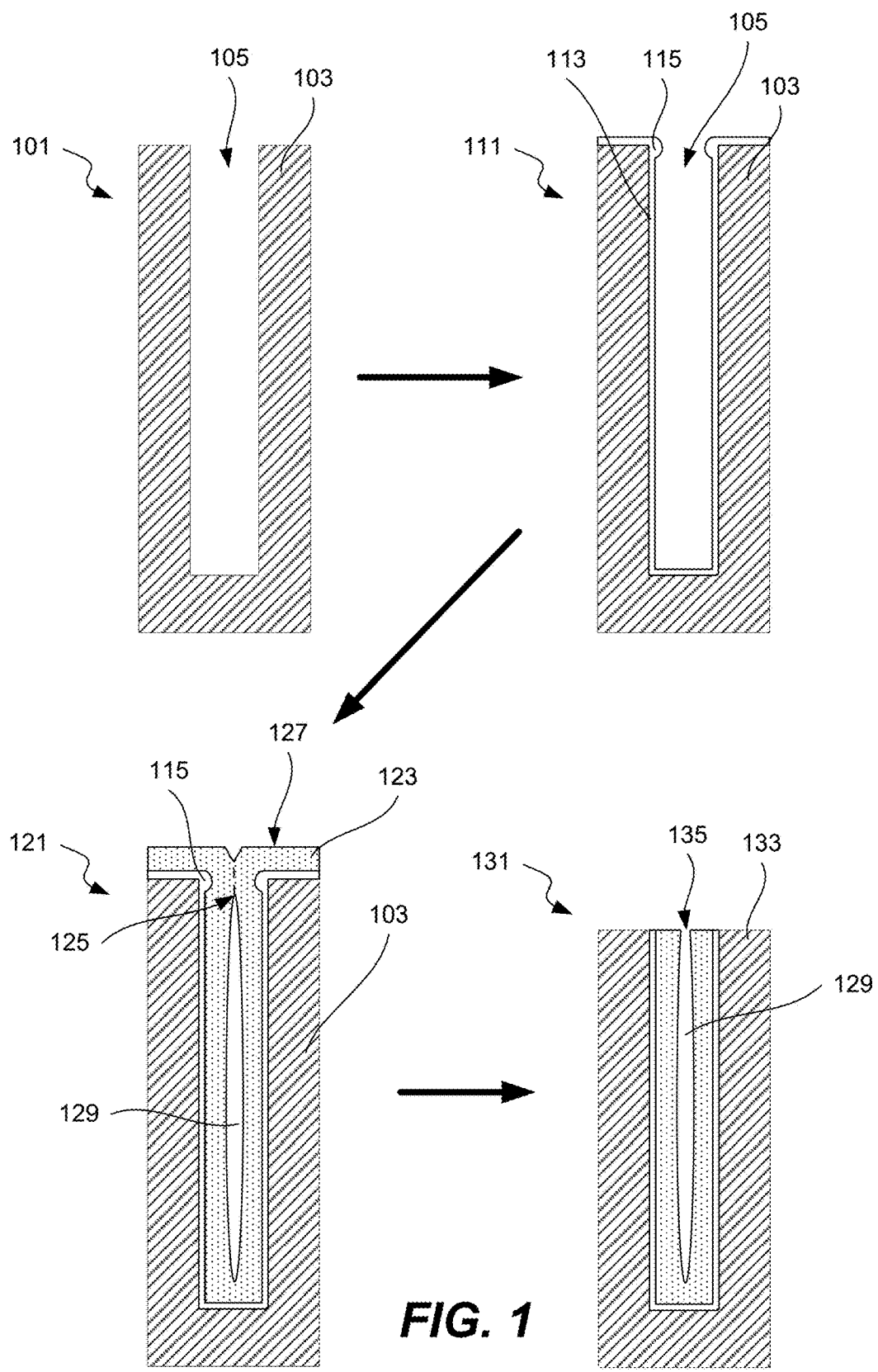
FIG. 1 illustrates an example of a semiconductor substrate containing a high aspect ratio feature at different stages of a process in accordance with certain embodiments.

There are multiple potential causes for seam formation. One is an overhang formed near the feature opening during deposition of tungsten-containing materials or, more typically, other materials, such as a diffusion barrier layer or a nucleation layer. FIG. 1 illustrates an example of a semiconductor substrate containing a high aspect ratio feature during different stages of semiconductor processing in accordance with certain embodiments. The first cross-section 101 shows a substrate 103 with a pre-formed feature hole 105. The substrate may be a silicon wafer, e.g., 200-mm wafer, 300-mm wafer, 450-mm wafer. The feature hole 105 may have an aspect ratio of at least about 2:1 or, in more specific embodiments, of at least about 4:1. The features hole 105 may also have a cross-section dimension near the opening (e.g., opening diameter, line width, etc.) of between about 10 nanometers to 500 nanometers, or more specifically between about 25 nanometers to 300 nanometers. The feature hole is sometimes referred to as an unfilled feature or simply a feature.

In the next stage (cross-section 111), the substrate 103 is shown with a deposited an under-layer 113 lining the feature hole 105, which may be a diffusion barrier layer, an adhesion layer, a nucleation layer, a combination of thereof, or any other applicable material. Because many deposition processes do not have good step coverage properties, i.e., more material is deposited on the field region and near the opening than inside the feature, the under-layer 113 may form an overhang 115. While the overhang 115 is a part of the under-layer 113, the layer 113 may be thicker near the opening than, for example, inside the feature. For the purposes of this description, "near the opening" is defined as an approximate position or an area within the feature (i.e., along the side wall of the feature) corresponding to between about 0-10% of the feature depth measured from the field region. In certain embodiments, the area near the opening corresponds to the area at the opening. Further, "inside the feature" is defined as an approximate position or an area within the feature corresponding to between about 20-60% of the feature depth measured from the field region on the top of the feature. Typically, when values for certain parameters (e.g., thicknesses) are specified "near the opening" or "inside the feature", these values represent a measurement or an average of multiple measurements taken within these positions/areas. In certain embodiments, an average thickness of the under-layer near the opening is at least about 10% greater than that inside the feature. In more specific embodiments, this difference may be at least about 25%, at least about 50%, or at least about 100%. Distribution of a material within a feature may also be characterized by its step coverage. For the purposes of this description, "step coverage" is defined as a ratio of two thicknesses, i.e., the thickness of the material inside the feature divided by the thickness of the material near the opening. In certain examples, the step coverage of the under-layer is less than about 100% or, more specifically, less than about 75% or even less than about 50%.

The next cross-section 121 illustrates the feature hole filled with the tungsten-containing materials 123. A deposition process may result in a conformal layer of the materials 123 built-up over the under-layer 113. This deposited layer follows the shape of the under-layer 113 including its overhang 115. In certain embodiments and, particularly, in later stages of the deposition process (e.g., right before feature closing), the layer 123 may become less conformal resulting in poor step coverage (i.e., more material being deposited near the opening than inside the feature). As the layer 123 thickens, it may close the feature forming a pinch point 125. Often some additional material is deposited above the pinch point 125 before the deposition process is stopped. Because of the overhang 115 and, in certain embodiments, the poor step coverage of the layer 123, the closed feature may have an unfilled void 129 (i.e., a seam) below the reference point 125. The size of the void 129 and the position of the reference point 125 with respect to the field region 127 depend on the size of the overhang 115, as well as the size, aspect ratio, and bowing of the feature, deposition process parameters, and other parameters.

Finally, cross-section 131 shows the substrate 133 after chemical-mechanical planarization (CMP), which removes a top layer from the substrate 103. CMP may be used to remove an overburden from the field region, such as parts of layers 113 and 123 that were present on the top surface of the substrate 103. Typically the substrate 103 is also thinned down during CMP to form the substrate 133. If the pinch point 125 falls above the planarization level of the CMP process, as in FIG. 1, the seam 129 opens up and is exposed to environment through the seam opening 135. The problems with open and large seams are described above.

Another cause that is not illustrated in FIG. 1 but that nevertheless may lead to seam formation or enlarging seams and moving the reference point closer to the field region is curved (or bowed) side walls of feature holes, which are also referred to as bowed features. In a bowed feature the cross-sectional dimension of the cavity near the opening is smaller than that inside the feature. Effects of these narrower openings in the bowed features are somewhat similar to the overhang problem described above. Further, bowed features may also have under-layers with overhangs and encounter other seam formation causes compounding negative effects of seam formation.

Complete eliminations of seams from the features filled with tungsten-containing materials may not be possible or practical. Some void spacing may remain inside the features, for example, due to large grains of the deposited materials, mass transport limitations during deposition, especially before feature closing, and other reasons. However, novel methods are presented herein that allow reducing seam sizes and moving reference points further away from the field region. These are collectively referred to as mitigating seam formation.

Process

It has been found that seam formation can be mitigated or, in some embodiments, eliminated by introducing one or more intermediate selective removal operations. For example, a filling process may start with forming an initial layer that at least partially fills a high aspect ratio feature. This operation is followed by partial selective removal of this initial layer and then depositing an additional layer. This removal-deposition cycle may be repeated until the feature is completely filled in a substantially void free manner. Process parameters may be selected such that the step coverage is improved at least one cycle. In certain embodiments, each cycle further improves the step coverage. Overall, selective removal can be characterized by more material removed near the opening than inside the feature. Various process control parameters may be employed to achieve these results including removal at mass-transport limiting conditions, controlling removal and/or adsorption rates of different etching components (e.g., activated and recombined species), controlling recombination rates of etching species, controlling pulsing of plasma, controlling plasma power, controlling plasma pulse length, controlling duty cycle of plasma pulsing, and others. For the purposes of this application, activated species, such as atomized species, radicals, and ions (e.g., atomic fluorine), are distinguished from recombined species, such as molecules including high energy state molecules (e.g., molecular fluorine), and from initial etchant species (e.g., nitrogen tri-fluoride and other precursors further described below).

Figure 2:
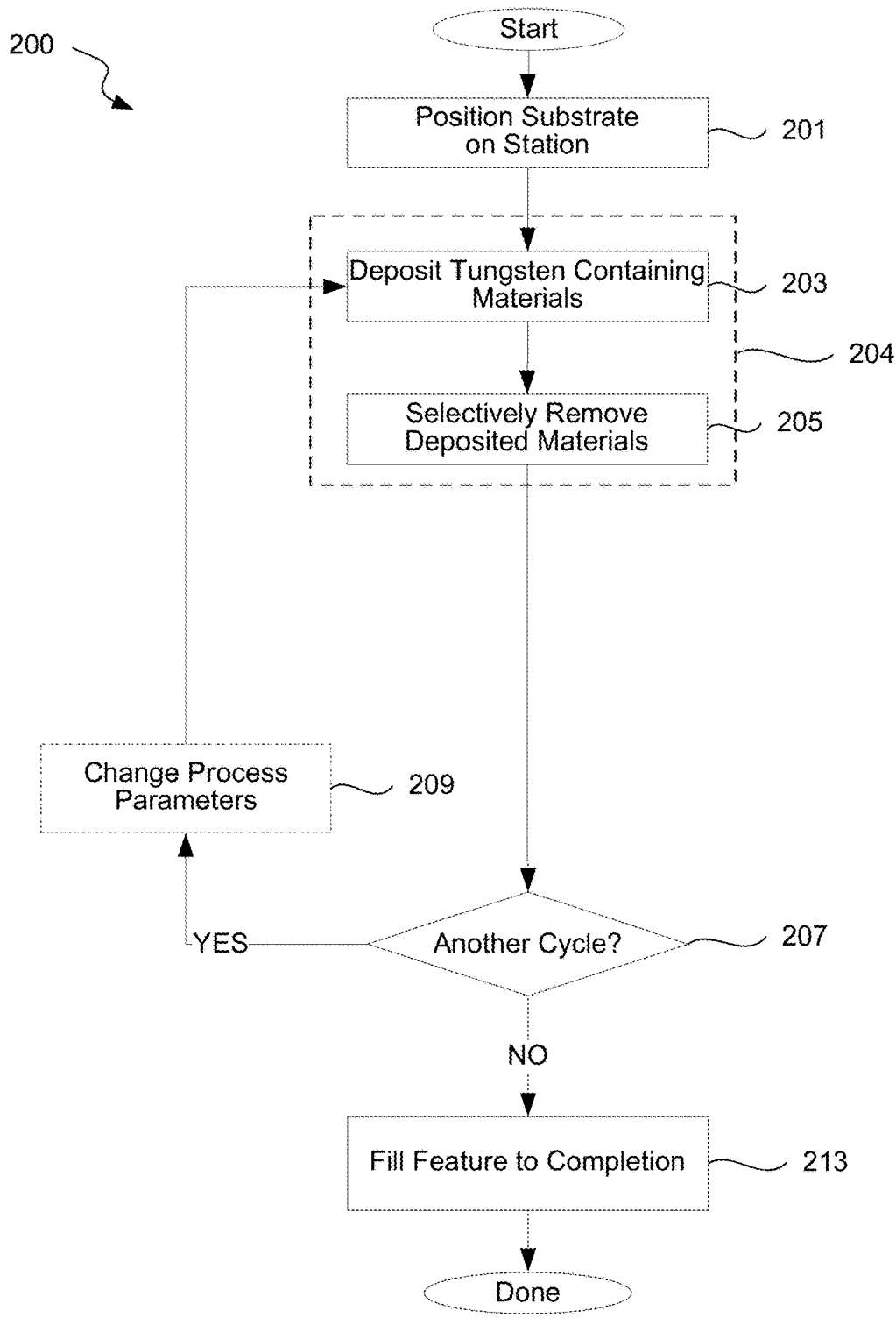
FIG. 2 illustrates a general process flowchart representing a method of filling high aspect ratio features with tungsten-containing materials in accordance with certain embodiments.

FIG. 2 illustrates a general process flowchart representing a method of filling high aspect ratio features with tungsten-containing materials in accordance with certain embodiments. A process 200 may start with positioning a substrate containing high aspect ratio features on a deposition station inside the processing chamber (block 201). The substrate may also have an under-layer, such as a diffusion barrier layer and/or tungsten nucleation layer. Certain substrate and under-layer details are provided above in the context of FIG. 1. In certain embodiments, an average thickness of an under-layer near the feature opening is at least about 25% greater than that inside the feature (e.g., near the bottom of the feature). In a more general sense, a substrate may have an under-layer that formed overhangs. In some cases, a layer of previously deposited bulk tungsten may be present in the feature. Features with overhangs are more prone to form voids during filling.

A diffusion barrier layer may be previously deposited onto the substrate to form a conformal layer that prevents diffusion of materials used to fill the features into surrounding materials of the substrate. Materials for the diffusion barrier layer may include tungsten nitride, titanium, titanium nitride, and others. The barrier layer may be between about 10 Angstroms and 500 Angstroms thick or, in more specific embodiments, between about 25 Angstroms and 200 Angstroms thick. In certain embodiments, a diffusion barrier layer is unevenly distributed on the substrate surface such that it forms overhang.

A nucleation layer is typically a thin conformal layer that facilitates subsequent deposition of bulk tungsten-containing material thereon. In certain embodiments, the nucleation layer is deposited using a pulsed nucleation layer (PNL) technique. In a PNL technique, pulses of the reducing agent, purge gases, and tungsten-containing precursor are sequentially injected into and purged from the reaction chamber.

The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. patent application Ser. No. 12/030,645 filed on Feb. 13, 2008, U.S. patent application Ser. No. 11/951,236, filed Dec. 5, 2007, and U.S. patent application Ser. No. 12/407,541, filed on Mar. 19, 2009, all of which are incorporated by reference herein its entirety for the purposes of describing tungsten deposition process. Additional discussion regarding PNL type processes can be found in U.S. Pat. Nos. 6,635,965, 6,844,258, 7,005,372 and 7,141,494 as well as in U.S. patent application Ser. No. 11/265,531, also incorporated herein by reference. In certain embodiments, a nucleation layer is unevenly distributed on the substrate surface such that it forms overhang. The methods described herein are not limited to a particular method of tungsten nucleation layer deposition, but include deposition of bulk tungsten film on tungsten nucleation layers formed by any method including PNL, ALD, CVD, PVD and any other method. Moreover, in certain embodiments, bulk tungsten may be deposited directly without use of a nucleation layer.

The deposition station may be also used to perform certain prior operations (e.g., deposition of a diffusion barrier layer, deposition of a nucleation layer) and/or subsequent operations (e.g., etching, another deposition, final feature filling). In certain embodiments, the deposition station may be specifically designated to perform deposition operation 203. The apparatus may also include additional deposition stations to perform the operation 203. For example, an initial deposition may be performed on the first deposition station. The substrate may be then moved to another station for etching. In certain embodiments further described below, an etching station is positioned in a different chamber to prevent cross-contamination between deposition and etching environments that use different materials and conditions for their respective operations. If the process then involves another deposition operation 203, the substrate may be returned back to the first deposition station or moved to another deposition station. Multiple deposition stations may be also used to perform parallel deposition operation 203 on several substrates. Additional details and apparatus embodiments are explained below in the context of FIG. 4 and FIGS. 5A-B.

The process may proceed with deposition of tungsten-containing materials onto the substrate (block 203). In certain embodiments, bulk deposition involves a chemical vapor deposition (CVD) process in which a tungsten-containing precursor is reduced by hydrogen to deposit tungsten. While tungsten hexafluoride ($WF_6$) is often used, the process may be performed with other tungsten precursors, including, but not limited to, tungsten hexachloride ($WCl_6$), organo-metallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten). In addition, while hydrogen is generally used as the reducing agent in the CVD deposition of the bulk tungsten layer, other reducing agents including silane may be used in addition or instead of hydrogen without departing from the scope of the disclosed embodiments. In another embodiment, tungsten hexacarbonyl ($W(CO)_6$) may be used with or without a reducing agent. Unlike with the PNL processes described above, in a CVD technique, the $WF_6$ and $H_2$ or other reactants are simultaneously introduced into the reaction chamber. This produces a continuous chemical reaction of mix reactant gases that continuously forms tungsten film on the substrate surface. Methods of depositing tungsten films using chemical vapor deposition (CVD) are described in U.S. patent application Ser. No. 12/202,126 filed Aug. 29, 2008 (now U.S. Pat. No. 8,551,885 issued Oct. 8, 2013), which is incorporated herein its entirety for the purposes of describing deposition processes. According to various embodiments, the methods described herein are not limited to a particular method of partially filling a feature but may include any appropriate deposition technique.

Figure 3:
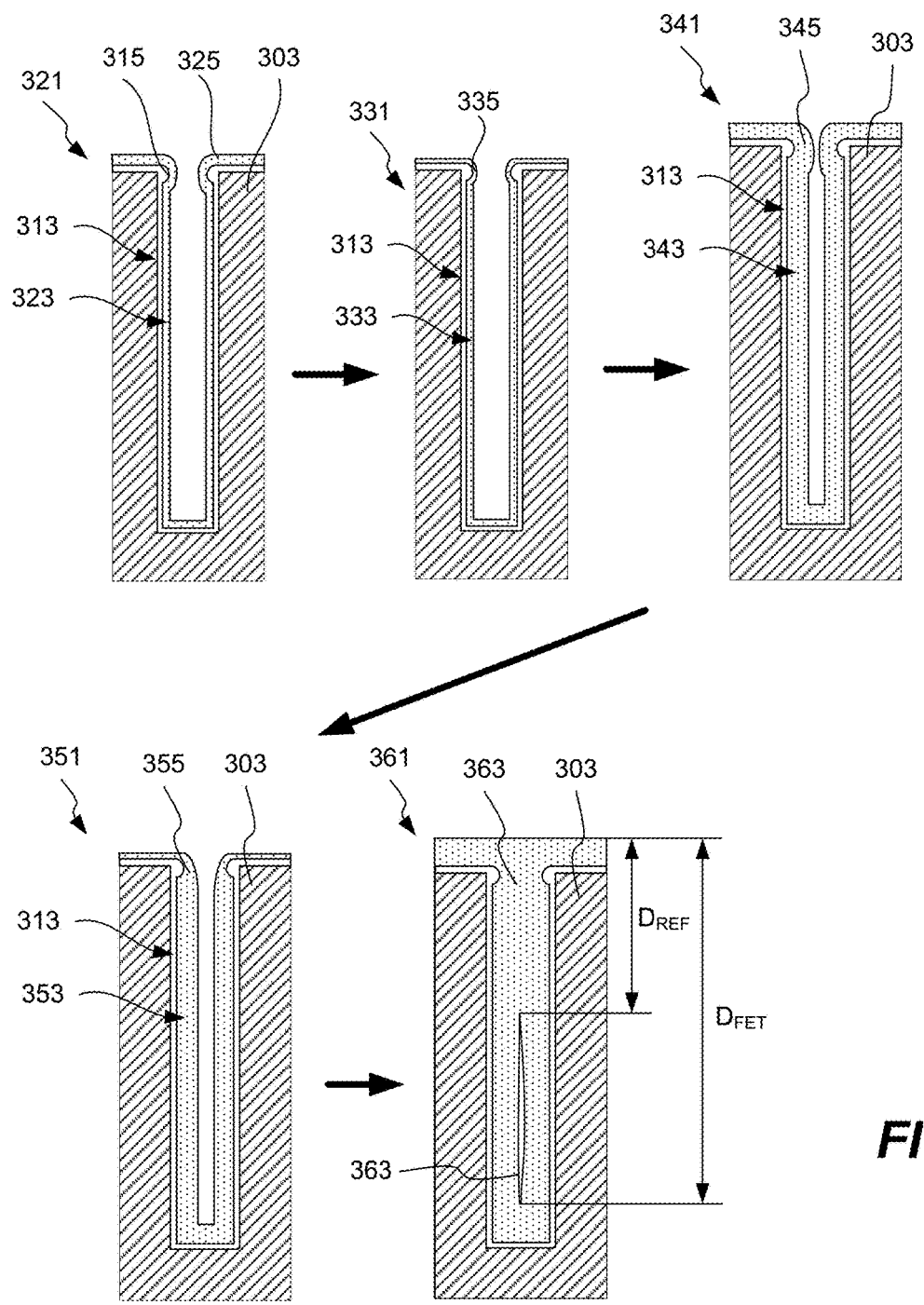
FIG. 3 illustrates schematic representations of substrate cross-sections at different stages of a filling process in accordance with certain embodiments.

FIG. 3 illustrates schematic representations of one example of the features' cross-sections at different stages of a filling process. Specifically, cross-section 321 represents an example of the feature after completing one of the initial deposition operations 203. At this stage of the process, substrate 303 may have a layer 323 of tungsten-containing materials deposited over under-layer 313. The size of the cavity near the opening may be narrower that inside the feature, for example, due to overhang 315 of the under-layer 313 and/or poor step coverage of the deposited layer 323, which are described in more detail above in the context of FIG. 1.

Returning to FIG. 2, the deposition operation 203 proceeds until the deposited layer (e.g., the layer 323) reaches a certain thickness. This thickness may depend on the cavity profile and opening size. In certain embodiments, the average thickness of the deposited layer near the opening may be between about 5% and 25% of the feature cross-sectional dimension including any under-layers, if ones are present. In other embodiments, the feature may be completely closed during the deposition operation 203 and then later re-opened during the selective removal operation (not shown).

In certain embodiments, a process chamber may be equipped with various sensors to perform in-situ metrology measurements to identify the extent of the deposition operation 203 and the removal operation 205. Examples of in-situ metrology include optical microscopy and X-Ray Fluorescence (XRF) for determining thickness of deposited films. Further, infrared (IR) spectroscopy may be used to detect amounts of tungsten fluorides (WFx) generated during etching operation. Finally, an under-layer, such as tungsten nucleation layer or a diffusion barrier layer, may be used as an etch-stop layer.

The process continues with a selective removal operation 205. Certain details of etching processes are described in U.S. patent application Ser. No. 12/535,377, entitled "METHOD FOR DEPOSITING TUNGSTEN FILM HAVING LOW RESISTIVITY, LOW ROUGHNESS AND HIGH REFLECTIVITY" by Chandrashekar et al., filed Aug. 4, 2009, which is incorporated herein in its entirety. The substrate may be moved from the deposition station to another station and, in more specific embodiment, another processing chamber with operating at different conditions, may continue being processed on the same station, or may be first removed from the deposition station (e.g., for storage) and then returned back to the deposition station for the selective removal of the deposited layer.

One way to achieve selective removal (i.e., to remove more deposited material near the opening than inside the feature) is to perform operation 205 in a mass transport limited regime. In this regime, the removal rate inside the feature is limited by amounts of and/or relative compositions of different etching material components (e.g., an initial etchant material, activated etchant species, and recombined etchant species) that diffuse into the feature. In certain examples, etching rates depend on various etchant components' concentrations at different locations inside the feature. It should be noted that the terms "etching" and "removal" are used interchangeably in this document. It should be understood that selective removal could be performed using any removal techniques, which includes etching as well as other techniques.

Mass transport limiting conditions may be characterized, in part, by overall etchant concentration variations. In certain embodiments, this concentration is less inside the feature than near its opening resulting in a higher etching rate near the opening than inside. This in turn leads to selective removal. Mass transport limiting process conditions may be achieved by supplying limited amounts of etchant into the processing chamber (e.g., use low etchant flow rates relative to the cavity profile and dimensions), while maintaining relative high etching rates in order to consume some etchant as it diffuses into the feature. In certain embodiment, a concentration gradient is substantial, which may be caused relatively high etching kinetics and relative low etchant supply. In certain embodiments, an etching rate near the opening may also be mass limited, but this condition is not required to achieve selective removal.

In addition to the overall etchant concentration variations inside high aspect ratio features, selective removal may be influenced by relative concentrations of different etchant components throughout the feature. These relative concentrations in turn depend by relative dynamics of dissociation and recombination processes of the etching species. Concentrations may also depend on plasma conditions, such as power, plasma pulsing period, pulse on time whereby plasma is pulsed during operation 205, and duty cycle (duration plasma is on during a period). It will be understood that plasma pulsing may involve repetitions of periods, each of which may last a duration T. The duration T includes the duration for pulse ON time (the duration for which the plasma is in an ON state) and the duration for plasma OFF time (the duration from which the plasma is in an OFF state) during a given period. The pulse frequency will be understood as 1/T. For example, for a plasma pulsing period T=100 μs, frequency is 1/T=1/100 μs, or 10 kHz. The duty cycle or duty ratio is the fraction or percentage in a period T during which the plasma is in the ON state such that duty cycle or duty ratio is pulse ON time divided by T. For example, for a plasma pulsing period T=100 μs, if a pulse ON time is 70 μs (such that the duration for which the plasma is in an ON state in a period is 70 μs) and a pulse OFF time is 30 μs (such that the duration for which the plasma is in an OFF state in a period is 30 μs), the duty cycle is 70%.

As further described below, an initial etchant material is typically passed through a remote plasma generator and/or subjected to an in-situ plasma in order to generate activated etchant species (e.g., fluorine atoms, radicals). In various embodiments, plasma pulsing as described herein may be used with either an in-situ plasma and/or a remote plasma generator. However, activated species may tend to recombine into less active recombined etching species (e.g., fluorine molecules) and/or react with tungsten-containing materials along their diffusion paths. As such, different parts of the deposited tungsten-containing layer may be exposed to different concentrations of different etchant materials, e.g., an initial etchant, activated etchant species, and recombined etchant species. This provides additional opportunities for controlling selective removal as described below.

For example, activated fluorine species are generally more reactive with tungsten-containing materials than initial etching materials and recombined etching materials. Furthermore, as evident from FIG. 7, the activated fluorine species are generally less sensitive to temperature variations than the recombined fluorine species. Therefore, process conditions may be controlled in such a way that removal is predominantly attributed to activated fluorine species. Furthermore, specific process conditions may result in activated fluorine species being present at higher concentrations near features' openings than inside the features. For example, some activated species may be consumed (e.g., react with deposited materials and/or adsorbed on its surface) and/or recombined while diffusing deeper into the features, especially in small high aspect ratio features. It should be noted that recombination of activated species also occurs outside of high aspect ratio features, e.g., in the showerhead of the processing chamber, and depends on a chamber pressure. Therefore, a chamber pressure may be specifically controlled to adjust concentrations of activated etching species at various points of the chamber and features. These and other process conditions will now be described in more detail.

According to various embodiments, a desired etch profile may be obtained by tuning the etch conformality. A combination of the right etch temperature, etchant flow etch pressure, and plasma pulsing can help to achieve the desired conformality. If the etch conformality is not tuned right for each type of re-entrant structure, this could result in poor fill even after the dep-etch-dep sequence.

Step coverage is proportional to (reactant species available for reaction)/(reaction rate). For some implementations of feature etch described herein in which the principle etchant is atomic fluorine, this can be simplified to:

$$W \text{ step coverage} \propto \frac{\text{(atomic } F \text{ concentration)}}{\text{etch rate}}$$

Accordingly, to achieve a certain tungsten etch step coverage (or desired etch conformality or etch non-conformality), the $NF_3$ flow rate (or other F-containing flow rate as described below), etch temperature, and pulsing are some relevant parameters since they directly affect the concentration of atomic fluorine and etch rate. Other variables like etch pressure and carrier gas flows also carry some significance.

At higher temperatures, the incoming fluorine atoms readily react and etch at the feature entrance, resulting in a more non-conformal etch; at lower temperature, the incoming fluorine atoms are able to diffuse and etch further into the feature, resulting in a more conformal etch. Higher etchant flow rate will result in more fluorine atoms generated, causing more fluorine atoms to diffuse and etch further into the feature, resulting in a more conformal etch. Lower etchant flow rate will result in fewer fluorine atoms generated, which will tend to react and etch at the feature entrance, resulting in a more non conformal etch. Higher pressure will cause more recombination of fluorine radicals to form molecular fluorine. Molecular fluorine has a lower sticking coefficient than fluorine radicals and so diffuses more readily into the feature before etching tungsten, leading to a more conformal etch.

In some embodiments, pulsing an RF plasma is used to tune the etch conformality. Pulsing an RF plasma may modulate the amount of fluorine species (which may include atoms, radicals, neutral, and other species) and the amount of nitrogen species (which may also include atoms, radicals, neutral, and other species).

In certain embodiments, selective removal operation 205 involves introducing an initial etchant material into the processing chamber and using it to selectively remove the deposited layer. An etchant selection depends on a deposited material. While this description focuses on tungsten containing materials, such as tungsten and tungsten nitride, it should be understood that other materials may be used for partial or complete filling of high aspect ratio features. Some example of these materials include such as other tungsten-containing materials (e.g., tungsten nitride (WN) and tungsten carbide (WC)), titanium-containing materials (e.g., titanium, titanium nitride, titanium silicide (TiSi), titanium carbide (TiC) and titanium aluminide (TiAl)), tantalum-containing materials (e.g., tantalum, tantalum nitride), ruthenium, nickel-containing materials (e.g., nickel (Ni) and nickel silicide (NiSi), and cobalt. These materials can be deposited using Physical Vapor Deposition (PVD), Chemical Vapor Deposition (CVD), Atomic Layer Deposition (ALD), and other deposition techniques. In general, operation 205 may be used to selectively remove any materials formed inside high aspect ratio features, including diffusion barrier layers, nucleation layers, and/or filling materials.

Example of initial etchant materials that can be used for selective removal of tungsten containing materials and some other materials include nitrogen tri-fluoride ($NF_3$), tetrafluoro-methane ($CF_4$), tetrafluoroethylene ($C_2F_4$), hexafluoroethane ($C_2F_6$), and octafluoropropane ($C_3F_8$), tri-fluoromethane ($CHF_3$), sulfur hexafluoride ($SF_6$), and molecular fluorine ($F_2$). In some embodiments, a combination of nitrogen-containing gases and fluorine-containing gases may be used, such as a mixture of nitrogen/fluorine ($N_2/F_2$). Disclosed embodiments involve a process that typically involves generating activate species, e.g., including radicals, ions, and/or high energy molecules. For example, an initial material may be flown through a remote plasma generator and/or subjected to an in-situ plasma.

As described above, in some embodiments, the amount of etchant material may be modulated by pulsing RF plasma power during operation 205. In some embodiments, $NF_3$ may form nitrogen and fluorine species, such that the relative amount of fluorine to nitrogen species may be modulated during operation 205. For example, in some embodiments, it may be possible to pulse RF plasma at varying conditions of power, pulse length, and/or duty cycle to produce a high nitrogen content, and pulse RF plasma at other conditions to produce a different ratio of nitrogen to fluorine species. In various embodiments, operation 205 involves generating a fluorine- and nitrogen-based plasma. It will be understood that the term "fluorine- and nitrogen-based plasma" as used herein refers to a plasma having a majority reactive species of fluorine and nitrogen. A carrier gas may also be flowed with etchant materials in larger concentrations, but the carrier gas is not a reactive species.

In some embodiments, plasma pulsing may also be used to inhibit nucleation of tungsten in subsequent deposition. In some embodiments, carbon and/or nitrogen from etchant materials used in operation 205 may passivate the surface to inhibit nucleation of tungsten and enhance gapfill. In various embodiments, plasma pulsing may be used to etch tungsten as well as inhibit nucleation of tungsten during deposition to enhance gapfill. For example, ratios of fluorine and nitrogen species as described herein may be modulated to perform more etch of tungsten than inhibition of nucleation of tungsten, or more inhibition than etch, as further described below.

In various embodiments, RF power may be ramped, which may be performed in addition to or alternatively from pulsing RF power. Ramped as used herein is defined as changing the conditions during exposure to a gas or plasma species. For example, in some embodiments, ramping RF may involve increasing RF power from zero to a selected RF power between about 50 W and 3000 W.

Figure 12A:
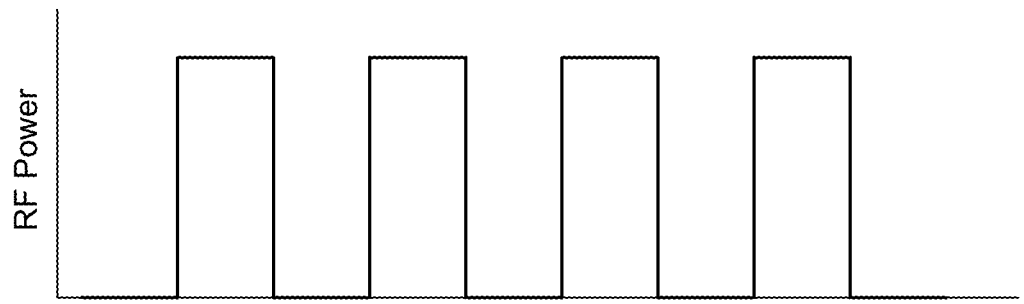
FIG. 12A illustrates an example pulsing scheme of radio frequency plasma power in accordance with certain embodiments.
Figure 12B:
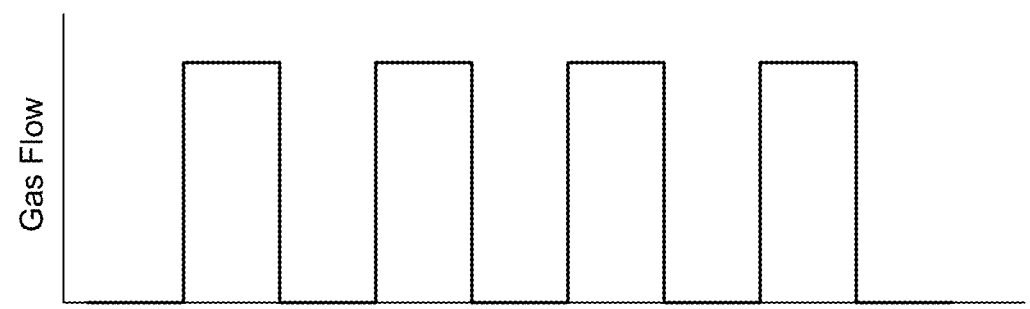
FIG. 12B illustrates an example pulsing scheme of gas flow in accordance with certain embodiments.
Figure 13:
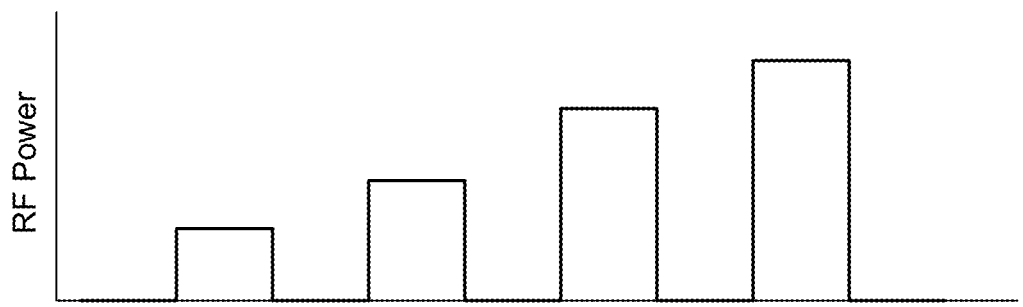
FIG. 13 illustrates an example pulsing and ramping scheme of frequency plasma power in accordance with certain embodiments.

Ramped RF power may allow independent control of available N radicals and F radicals within the module at a given time by modulating RF. This flexibility provides additional knobs to control the ratio of fluorine to nitrogen for gapfill applications. FIGS. 12A and 12B provide examples of pulsing schemes with RF pulsing (12A) and gas pulsing (12B). FIG. 13 provides an example of a pulsing scheme whereby RF ramping is performed.

In some embodiments, the ratio of nitrogen to fluorine species depends on the RF frequency. For examples, in some embodiments, the plasma frequency may be in the kHz range. By controlling frequency and duty ratio, the duration for which the substrate is exposed to the plasma can be reduced. It also modulates the plasma on and off durations, and, as a result, changes plasma properties such as the plasma density and the electron energy distribution to thereby affect the N radical and F radical generation rates. Modulating the frequency and duty ratio may reduce the N radical generation more dramatically than F radical generation.

In some embodiments, the frequency of the RF pulsing plasma may be between about 1 Hz and about 400 kHz, or between 1 Hz and about 100 kHz, or between about 10 Hz and about 100 kHz, or between about 100 Hz and about 10 kHz. The duty cycle may be between about 1% and about 99%, or between about 10% and about 90%. In some embodiments, the duration in which RF power is ON in each pulse may be between about 100 milliseconds and about 10 seconds, or between about 100 milliseconds and about 5 seconds. In some embodiments, RF power during ON periods may be between about 50 W and about 3000 W. In some embodiments, RF power may be both ramped and pulsed. The RF power may be ramped or maintained at a selected power during exposure to gases. In some embodiments, within the duration of performing operation 205, the RF power is ramped from 0 W to a selected RF power and maintained at the selected RF power such that the last pulses are maintained at the same RF power.

Gas pulsing may be performed with RF pulsing and/or ramping. For example, as shown in FIG. 12B, in some embodiments, gas flow (such as argon flow) may be between about 0 sccm and about 500 sccm, while gas flow of $NF_3$ may be between about 1 sccm and about 200 sccm. The gas flow may be pulsed at a frequency having a duty cycle between about 30% and about 70%. In some embodiments, gas flow may be on for 1 second and off for 2 seconds in one example cycle. A full cycle including on and off periods for a gas flow may be between about 200 milliseconds and about 5 seconds, or between about 0.5 seconds and about 3 seconds.

Disclosed embodiments may also maintain a high peak power (thus maintaining the ICP mode) but may also maintain low average power (plasma density low). Accordingly, a low power CCP mode would not be used in some embodiments.

The duration for ramping conditions may be between about 100 ms and about 2 seconds, for power. For example, RF power may be modulated over a duration of about 100 ms by increasing RF power. In some embodiments, a low power regime may reduce the N radical. The implementation of such ramping may be implemented in a recipe, and existing hardware tools may be suitable for performing some disclosed embodiments. For example, pulsing generators may be used in some embodiments. The generator itself may be capable of performing power ramping such as performing ramping for a duration between about a few ms to about 1000 ms range if using timing mode. In some embodiments, slow ramping and fast RF power pulsing can be combined.

In various embodiments, RF power is ramped throughout two or more cycles of operations 203 and 205. In some embodiments, ramping is performed throughout some but not all cycles of repeating operations 203 and 205. In some embodiments, operation 205 involves multiple pulses of RF power and/or gas flow, and RF power may be ramped in each pulse. In some embodiments, ramping is performed in operation 205 over the duration of multiple pulses. In some embodiments, ramping may be performed such that RF power is ramped, maintained at a first power, ramped again, and maintained at a second power, and so on. In various embodiments, ramping may be combined with pulsing. For example, RF power may be ramped and pulsed while gas flow is also pulsed. RF power may be ramped and pulsed by setting an initial RF power and a final RF power for ramping, and pulsed as the RF power increases between the initial RF power and the final RF power. In some embodiments, ramping may be performed by increasing RF power linearly. In some embodiments, ramping may be performed by increasing RF power nonlinearly (such that the difference between RF power between two pulses increases over time or decreases over time).

Flow rates of the etchant typically depend on a size of the chamber, etching rates, etching uniformity, and other parameters. Typically, a flow rate is selected in such a way that more tungsten-containing material is removed near the opening than inside the feature. In certain embodiments, these flow rates cause mass-transport limited selective removal. For example, a flow rate for a 195-liter chamber per station may be between about 25 sccm and 10,000 sccm or, in more specific embodiments, between about 50 sccm and 1,000 sccm. In certain embodiments, the flow rate is less than about 2,000 sccm, less than about 1,000 sccm, or more specifically less than about 500 sccm. It should be noted that these values are presented for one individual station configured for processing a 300-mm wafer substrate. A person having ordinary skills in the art would understand that, for example, these flow rates can be scaled up or down depending on a substrate size, a number of stations in the apparatus (e.g., quadruple for a four station apparatus), a processing chamber volume, and other factors.

In certain embodiments, the substrate needs to be heated up or cooled down before the removal operation 205 can proceed. Various devices may be used to bring the substrate to the predetermined temperature, such as a heating or cooling element in a station (e.g., an electrical resistance heater installed in a pedestal or a heat transfer fluid circulated through a pedestal), infrared lamps above the substrate, igniting plasma, etc.

A predetermined temperature for the substrate is selected in such a way to not only induce a chemical reaction between the deposited layer and various etchant species but also to control the rate of the reaction between the two. For example, a temperature may be selected to have high removal rates such that more material is removed near the opening than inside the feature. Furthermore, a temperature may be also selected to control recombination of activated species (e.g., recombination of atomic fluorine into molecular fluorine) and/or control which species (e.g., activated or recombined species) contribute predominantly to etching. Overall, the substrate temperature may be selected based on etchant chemical compositions, a desired etching rate, desired concentration distributions of activated species, desired contributions to selective removal by different species, and other material and process parameters. In certain embodiments, a substrate is maintained at less than about 300° C., or more particularly at less than about 250° C., or less than about 150° C., or even less than about 100° C. In other embodiments, a substrate is heated to between about 300° C. and 450° C. or, in more specific embodiments, to between about 350° C. and 400° C. Other temperature ranges may be used for different types of etchants.

As described above, disclosed embodiments may use a fluorine-containing etch chemistry such as $NF_3$ to improve gapfill of CVD tungsten deposition for a 20 nm via metal contact. As described herein, fluorine species, which may include radicals, may be used to etch tungsten, which may be a tungsten underlayer. However, nitrogen species, which may include radicals, generated from the etch process may react with tungsten resulting in incubation delay of subsequent tungsten growth and causing gapfill issues. Reducing RF power could reduce nitrogen radical but fluorine radical would also be reduced leading to undesired etch profile.

Selective etch may also be performed by modulating plasma power used during operation 205. For example, a plasma generator may be pulsed, or a program may be used to control pulsing of a plasma generator, to tune the ratio of a fluorine radical to a nitrogen radial during the selective etch. In various embodiments, modulating plasma power will tailor the tungsten etch profile while minimizing incubation delay of subsequent tungsten growth, thereby controlling processes of disclosed embodiments. In some embodiments, this may be used for vias with an opening of about 20 nm, such as vias used to form metal contacts.

As described herein, disclosed embodiments may involve modulating RF power level by pulsing at different frequencies and duty ratios. Nitrogen radical generation rate constant in some embodiments may be more sensitively dependent on the plasma density and power than fluorine radicals are. Accordingly, power modulation can be used to increase fluorine to nitrogen radical ratio for optimal tungsten etch profile while minimizing incubation delay of subsequent tungsten growth.

Modulating fluorine to nitrogen radical ratio through RF allows larger gapfill window and better process control within a wafer. As described above, some plasmas, such as $NF_3$ plasma, may be used to inhibit tungsten nucleation by passivating a surface of deposited tungsten in a feature. The modulation of nitrogen species, which may include radicals, among all etchant species (such as radicals) inducing incubation delay by power modulation can also be used for processes involving inhibition of nucleation of tungsten, such as by exposing tungsten to a nitrogen-containing inhibitor during deposition. For example, passivation may be controlled whereby exposure of a tungsten layer to nitrogen species passivates the tungsten layer, thereby inhibiting tungsten nucleation on the surface.

Additional examples and descriptions of tungsten deposition involving inhibition of nucleation are described in U.S. Patent Application Publication No. 2013/0171822, entitled "TUNGSTEN FEATURE FILL WITH NUCLEATION INHIBITION," filed on Feb. 22, 2013; and U.S. Patent Application No. 2013/0302980, entitled "TUNGSTEN FEATURE FILL," filed on Mar. 27, 2013, which are herein incorporated by reference in their entireties.

In some embodiments a two-step process is performed in the same module or otherwise without breaking vacuum. As described above, in some examples, an $NF_3$ remote plasma is initially pulsed under conditions of power/pulse length/duty cycle to produce a very high N content and then conditions are changed to produce a different ratio (e.g. N/F<<1) for a subsequent etch back step. In some embodiments, pulsing may be used to tune an inhibition profile in a feature.

Other examples of deposition/etch/deposition processes are described in U.S. Pat. No. 8,119,527 entitled "DEPOSITING TUNGSTEN INTO HIGH ASPECT RATIO FEATURES," issued on Feb. 21, 2012; U.S. Patent Application Publication No. 2013/0302980, entitled "TUNGSTEN FEATURE FILL," filed on Mar. 27, 2013; U.S. Pat. No. 9,034,768 entitled "DEPOSITING TUNGSTEN INTO HIGH ASPECT RATIO FEATURES," issued on May 19, 2015; and U.S. Patent Application Publication No. 2015/0024592, entitled "VOID FREE TUNGSTEN FILL IN DIFFERENT SIZED FEATURES," filed on Jul. 25, 2014, all of which are herein incorporated by reference in their entireties.

It has been determined that activated species provide not only faster but also more desirable selective removal than their recombined counterparts. As such, various approaches have been developed to increase relative concentrations and/or removal contributions of the activated species. For example, activation energy of activated fluorine species is much less than that of the recombined fluorine. Therefore, lowering substrate temperatures may result in more removal contribution from activated species. At certain temperatures (and other process conditions, e.g., flow rates and chamber pressures), a relative removal contribution of the activated species may exceed that of the recombined species.

Figure 7:
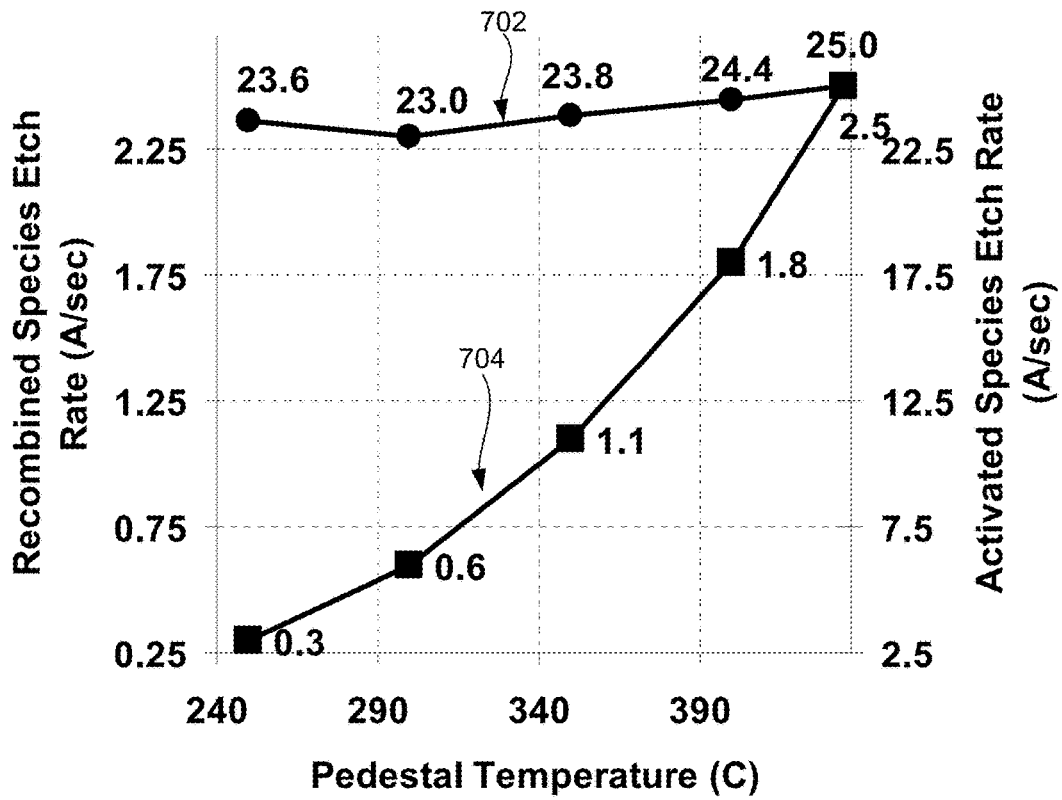
FIG. 7 is a plot of etching rates of activated fluorine species and recombined fluorine species as a function of the pedestal temperature.

FIG. 7 is a plot of two etching rates as a function of the pedestal temperature for activated species (line 702) and for recombined species (line 704). Etching tests were modeled using a nitrogen tri-fluoride precursor supplied into the processing chamber through a remote plasma generator at 400 sccm for 20 seconds (line 702) and a molecular fluorine precursor supplied at 500 sccm for 50 seconds (line 704). The chamber pressure was kept at 1 Torr during both tests. The results indicate that the etch rate corresponding to the recombined fluorine molecules (line 704) can be substantially reduced by lowering the pedestal temperature. At the same time, the etch rate corresponding to the activated species (line 702) remains relative flat, i.e., it is not as sensitive to the pedestal temperature as line 702.

In certain embodiments, it may be difficult to eliminate or even substantially minimize recombined species from contacting the substrate surface (e.g., to minimize recombination of activated species). For example, an apparatus typically include a showerhead (further explained in the context of FIG. 4), which causes substantial recombination of previously activated etchant species (e.g., flowing from a remote plasma generator through a showerhead). This may be a result, for example, of a longer residence time within a closed volume of the showerhead and its high surface-to-volume ratio. While recombination may be still present in the system, it has been determined that effect of recombined species of partial removal may be reduced by a substrate temperature during this operation. Atomic fluorine has much lower activation energy than molecular fluorine (0.33 eV v. 0.55 eV). This relationship generally holds for other activated and recombined species. As such, etching contributions of recombined species can be reduced by lowering temperature during the etching operation.

Another process parameter that may affect recombination of activated species is a pressure inside the chamber or, more specifically, partial pressures of different materials that may be present in the chamber (e.g., initial etchant materials, activated species, recombined species, carrier gases, reaction products, etc.). A higher total pressure (e.g., greater than about 10 Torr) generally corresponds to shorter mean free paths of the activated etchant species resulting in more collisions between the species, which in turn results in a higher recombination rate. Furthermore, it has been found that a sticking probability of some recombined species (e.g., molecular fluorine) on a tungsten surface or other similar surfaces is lower than that of activated species (e.g., atomic fluorine) at low pressure levels. A low sticking probability tends to improve step coverage.

Figure 8:
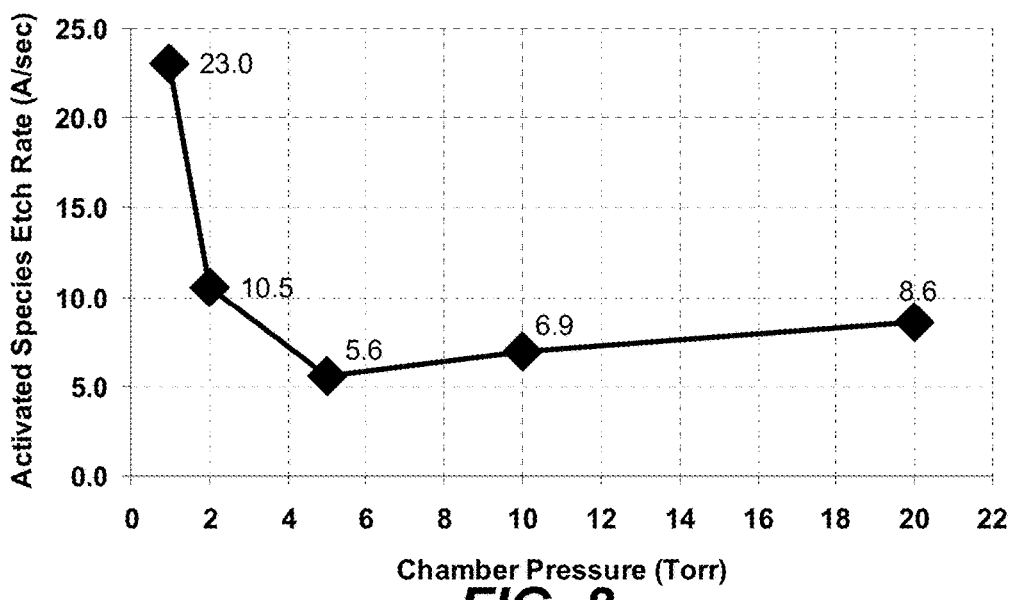
FIG. 8 is a plot of an etching rate of activated fluorine species as a function of the chamber pressure.

FIG. 8 is a plot of an etch rate as a function of the chamber pressure for a nitrogen tri-fluoride precursor supplied into the processing chamber at 400 sccm for 20 seconds. The substrate was kept at 300° C. during this experiment. The results show that between 1 Torr and 5 Torr an increase in pressure resulted in lower etching rates. Without being restricted to any particular theory, it is believed that higher pressures at this level leads to higher recombination rates of activated species into recombined species, which are less reactive leading to lower etching rates. This recombination and lower etching reactivity actually offsets any increases caused by higher overall etchant concentrations. As pressure further increased above 5 Torr, higher concentrations of etching materials results in some moderate increases in etching rates. It is believed that removal is predominantly controlled by the recombined species at this pressure levels. As such in order to have a greater contribution from activated species, a process chamber needs to be kept at lower overall pressure values. In certain embodiments, a process chamber is maintained at less than about 5 Torr, or more specifically at less than about 2 Torr, or even at less than about 1 Torr or less than about 0.1 Torr.

Returning to FIG. 2, the reduction in the average thickness of the deposited layer near the opening may be greater than that inside the feature as a result of the selective removal operation 205. In certain embodiments, the reduction near the opening is at least about 10% greater than the reduction inside the feature or, in more specific embodiments, is at least about 25% greater. The removal operation 205 may generally be performed up to the point at which the substrate or any under-layer, if one is present, is exposed to the etchant. The remaining layer may be characterized with step coverage. In certain embodiments, step coverage of the etched layer is at least about 75%, more specifically at least about 100%, or at least about 125%, more even more specifically at least about 150%.

In certain embodiments, a removal operation is performed such that a passivated surface is formed. This surface inhibits deposition of tungsten-containing materials in the subsequent deposition cycle. Forming a passivated surface is described below in the context of FIG. 2, though it should be noted that it is not so limited and may be performed in any tungsten deposition process by appropriately employing an etch process. Passivation, and thus subsequent tungsten deposition, may be selective or non-selective with respect to the feature depth or other geographic region of deposition surface, by appropriately tuning the etching conditions as described herein. As described above, in some embodiments, passivation may also be controlled by modulating plasma pulsing during operation 205. For example, pulsed plasma conditions such as power, pulse length, and duty cycle may modulate the amount of nitrogen species in the plasma to control the amount of passivation.

Returning to FIG. 2, in certain embodiments, the selective removal operation 205 is performed at certain process conditions that result in formation of a layer, which may be referred to as a remaining layer, having a passivated surface. In certain embodiments, the passivation is differential along the depth of the high aspect ratio features due to different etching conditions (e.g., concentrations of activated species) along this dimension as described above. For example, process conditions during this operation may be specifically tuned to cause more passivation near the features' openings than inside the features. Generally, these conditions correspond to low pressures (e.g., less than 8 Torr and even less than 5 Torr) and prolonged etching (e.g., more than 1 seconds and even more than 5 seconds for typical 30-nanometer features). This phenomenon will now be described in more detail with reference to FIG. 9.

Figure 9:
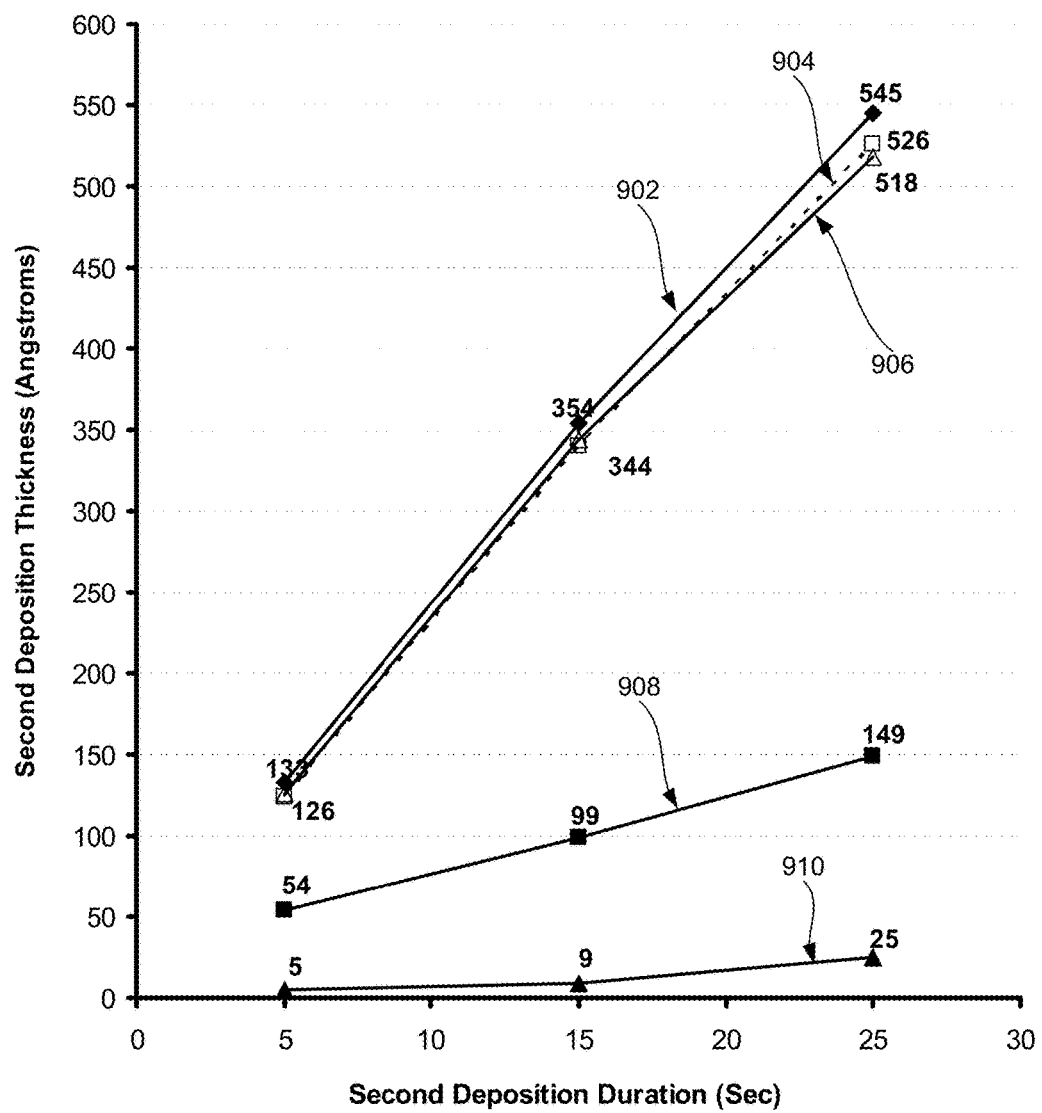
FIG. 9 is a plot of deposition thicknesses as a function of time for various samples processed using different etching conditions.

FIG. 9 is a plot of second deposition cycle deposition thicknesses as a function of time for five sets of wafers processed using different etching conditions. This plot illustrates effects of different passivation levels caused by these etching conditions on deposition rates. In this experiment, surfaces of the five sets of wafers were deposited with an initial tungsten layer. The same deposition conditions were used for all five sets. Then each set of wafers was processed using different etching conditions. The first set of wafers corresponding to line 902 in FIG. 9 (the top solid identified by numerical values 133, 354, and 545 in the plot) was not etched at all. In other words, the first deposition cycle was followed by the second deposition cycle without any intermediate etching cycles. The second set of wafers corresponding to line 904 (the middle dashed line identified by a numerical value 526; other numerical values not shown because of the close proximity to the other two lines) was etched at 18 Torr for a period of 7 seconds. The third set of wafers corresponding to line 906 (the bottom solid line in the top group of three lines identified by numerical values 126, 344, and 517) was etched at 18 Torr for a period of 17 seconds. The fourth set of wafers corresponding to line 908 (identified by numerical values 54, 99, and 149) was etched at 0.8 Torr for a period of 5 seconds. Finally, the fifth set of wafers corresponding to line 908 (identified by numerical values 5, 9, and 25) was etched at 0.8 Torr for a period of 10 seconds. These five sets of wafers were then subjected to same deposition conditions for three periods of time (i.e., 5 seconds, 15 seconds, and 25 seconds) to form addition tungsten layers. The resulting thicknesses of these additional tungsten layers are presented in FIG. 9.

FIG. 9 illustrates that the first three sets of wafers (i.e., the wafers subjected to no etching or etching at 18 Torr) have much thicker additional tungsten layers deposited in the second deposition cycle than the last two sets of wafers (i.e., the wafers subjected to etching at 0.8 Torr). As explained above with reference to FIG. 8, higher pressure levels may result in recombination of activated etching species (e.g., atomic fluorine into molecular fluorine) and, to a certain degree, different chemical reactions during etching. Resulting etched layers processed at different pressure levels during etching may have different characteristics, such as chemical compositions and/or physical structures, at least on their exposed surfaces. This, in turn, impacts deposition of the later deposited layers of tungsten as shown in FIG. 9. Specifically, FIG. 9 demonstrates that etching at a lower pressure and for a longer period of time results in a more passivated remaining layer that inhibits deposition of at least the subsequent layer. At the same time, lower pressure levels correspond to more aggressive etching as evidenced from FIG. 8. A combination of pressure and etching duration should be carefully controlled to prevent complete removal of the initial deposited layer and deteriorating the underlying diffusion barrier layer.

While some passivation is generally desirable near the feature's opening, it is less desirable and, in certain embodiments, should be avoided inside the feature. As described above, in some embodiments, plasma may be pulsed to etch and/or passivate the material deposited in the feature. The amount of passivation may be controlled by pulsing the plasma at varying conditions, such as different plasma powers, plasma pulse lengths, and duty cycle. For example, in some embodiments, pulses of plasma may include more nitrogen species than fluorine species to allow more passivation. It has been found that at certain process conditions high aspect ratio features become differentially passivated during etching such that the remaining layer is more passivated near the opening than inside the feature. Without being restricted to any particular theory, it is believed that etching at lower pressure levels may result in mass-transport limiting conditions within high aspect ratio features where higher concentrations of the activated etchant species are present near the features' openings than inside the features. Some activated etchant species are consumed during etching the layer near the opening while some other activated species are recombined while diffusing into the features.

Figure 10:
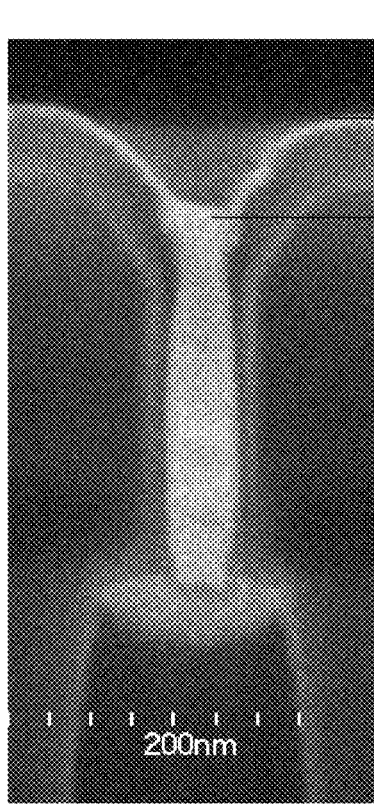
FIG. 10 illustrates a cross-sectional Scanning Electron Microscopy (SEM) image of a 30-nanometer feature after initial tungsten deposition, 3-second etch, and additional tungsten deposition.
Figure 11:
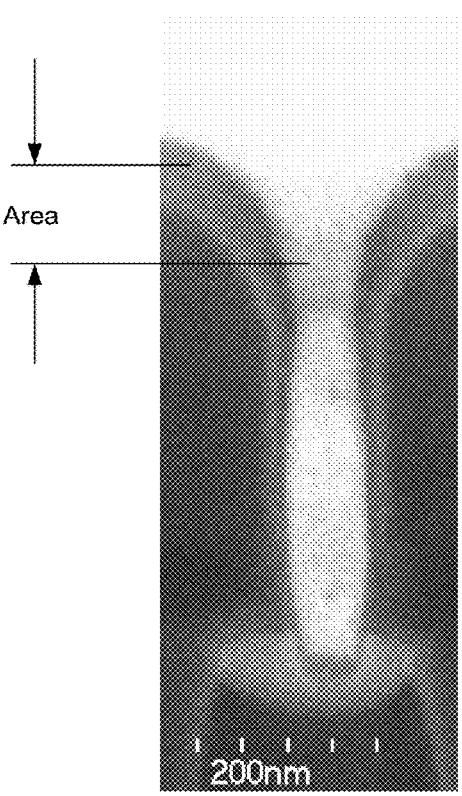
FIG. 11 illustrates a cross-sectional SEM image of another 30-nanometer feature after the same initial tungsten deposition, 1-second etch, and the same additional tungsten deposition.

Even passivation near the features' openings should be carefully controlled to prevent excessive passivation in these areas and allow for sufficient deposition during later operations in order to completely fill and close the feature. This concern is reflected in FIGS. 10 and 11. Specifically, FIG. 10 shows a cross-sectional Scanning Electron Microscopy (SEM) image of a 30-nanometer feature after initial tungsten deposition followed by 3-second etching and then additional tungsten deposition. The top area of this feature remained unfilled even though the bottom area is completely filled. While a gradual bottom-up fill caused by differential passivation is desirable to avoid premature closing of the feature and formation of the seam, excessive passivation may result in unfilled features such as the one presented in FIG. 10, which may not be desirable or acceptable. FIG. 11 shows a cross-sectional SEM image of another 30-nanometer feature after the same initial tungsten deposition followed by 1-second etching and then the same additional tungsten deposition. The top portion of this feature was completely filled. In some cases, while some passivation near the features' opening is desirable, over-passivation is avoided.

In light of these considerations, process conditions may be specifically tuned to achieve desirable processing results, such as completely filling high aspect ratio features in a substantially void free manner. For example, in some embodiments, process conditions during plasma pulsing may involve modulating plasma power, plasma pulse length, duty cycle, number of pulsing cycles, etc. Some of these process conditions include performing the removal operation at a pressure of less than 5 Torr, or less than 2 Torr, or even less than 1 Torr. In certain embodiments, the pressure is maintained at between about 0.1 Torr and 5 Torr or, more specifically, between about 0.5 Torr and 3 Torr. Duration of the etching operation generally depends on a thickness of the initial layer, which, in turn, is generally kept to less than about a half of the feature size in order to prevent closing of the feature. For example, an initial layer deposited over the substrate surface containing 30-nanometer features is generally less than 15 nanometers. Such a layer may be etched for at least about 1 second or, more specifically, for at least about 3 seconds, or even at least about 5 seconds without damaging any of the underlying layers. In specific embodiments, duration of the etching operation is between about 1 and 10 seconds or, even more specifically, between about 3 and 5 seconds. Etching conditions may be also described with reference to the remaining layer and the size of the feature. In certain embodiments, the remaining layer has a thickness of less than 10% of the feature opening.

In certain embodiments, the substrate may include one or more features that are closed during the deposition operation 203 and remain closed during the selective removal operation 205. For example, a substrate may include small, medium size, and large features. Some small features may close during the initial deposition operation and never open again. Medium size features may close during later cycles and remain closed while other larger features are being filled. In certain embodiments, features may be present at different vertical levels of the substrates, e.g., in a dual-damascene arrangements. The features on lower-levels may close earlier than features in higher-levels.

In certain embodiments, the deposition operation 203 may only temporarily close the feature. Unlike closing the feature during a final filling operation, such as operation 213 described below, or in the situation with multiple features of different sizes and vertical positions described above, the seam during this temporary closure may be still unacceptably large or start too close to the field region. In these embodiments, the selective removal operation 205 may be designed in such a way that the first part of the operation 205 is used to re-open the feature and then the next part of the operation 205 is used for selective removal of the deposited material. The process conditions in these two parts may be the same or different. For example, the etchant flow rate may be higher during the first part of the operation 205 and then decreased as the feature opens up.

A deposition-removal cycle including the deposition operation 203 and the selective removal operation 205 may be repeated one or more times as indicated by decision block 207. For example, it may be difficult to achieve desirable step coverage after one cycle, particularly, in small features with large overhangs. Considerations in a decision 207 whether to proceed with another cycle include overhang size, feature size, feature aspect ratio, feature bowing, as well as seam size and seam location requirements.

In certain embodiments, process parameters for one or both operations in the next cycle may be changed (block 209). For example, net deposition during initial cycles may need to be greater than in the later cycles because the deposited layer is still thin layer and the risk of contamination during etching is high. At the same time, the cavity is more open initially and the risk of closing is lower. For example, initial deposition cycles may be performed at slower deposition rates (e.g., driven by lower temperatures and/or chamber pressure) to achieve greater control over amounts of the tungsten containing materials deposited on the partially manufactured substrate. Slower rates may lead to a more conformal deposition as described above, which may be needed for certain feature types, in particular small, high aspect ratio features. Subsequent deposition cycles may be performed at faster deposition rates (e.g., driven by higher temperatures and/or chamber pressure) since control over a deposited thickness may be less critical and/or previous deposition-etching cycles may have already modified profiles of the cavities in such way that these cavities are less likely to close prematurely. In other embodiments, deposition operation in later cycles may be performed at slower deposition rated because remaining cavities are smaller and may be prone to premature closing. Likewise, etching process conditions may modified from one cycle to another starting, for example, with less aggressive etching conditions while deposited layers are still thin and eventually turning to more aggressive etching conditions.

Returning to FIG. 3, cross-section 331 depicts the feature after selective removal. Thus, cross-sections 321 and 331 may represent the first cycle or, more generally, one of the initial cycles. The deposited layer 323 during this cycle may be too thin to completely compensate for or offset various seam formation causes, such as the overhang 315. For example, after the selective removal operation the cavity shown in cross-section 331 is still narrower near the opening than inside the feature. In certain embodiments, this difference (how much narrower) may be sufficiently small that the process continues to a final filling operation without repeating the deposition-removal cycle.

Cross-sections 341 and 351 illustrate the substrate 303 during and after later cycles. First, cross-section 341 shows a new deposited layer 343 formed over etched layer 333. The feature with layer 343 may have an improved profile reflecting better step coverage achieved during the previous cycles. However, the profile of the cavity may still not allow proceeding to final filling and another etching operation may be needed to further shape this cavity. Cross-section 351 represents the substrate 303 at a stage prior to a final deposition to complete the fill. The cavity is wider near the opening than inside the cavity. In certain embodiments, step coverage of the new deposited layer is at least about 10% greater than that of the initially deposited layer or, in more specific embodiments, at least about 20% greater or at least about 30% greater.

Returning to FIG. 2, in certain embodiments, the deposition operation 203 and the selective removal operation 205 may be performed simultaneously, which is represented by a block 204. For example, a precursor and an etchant may be flown into the processing chamber at the same time allowing for both deposition and etching reactions to occur simultaneously. In order to achieve greater net deposition inside the feature than near the opening, at least initially, the flow rates of the etchant and the tungsten-containing precursor may be such that the etching reaction is mass-transport limited and, therefore, depends on the etchant concentration. At the same time, the deposition reaction is not mass-transport limited and proceeds at about the same rates inside the feature and the opening. An etchant or precursor flow rate or both may be adjusted (e.g., gradually or in stepwise fashion) during the operation 204, and at some point the etchant flow into the processing camber may be discontinued. At this point, the process may transition to a final fill operation 213 described below.

After one or more deposition-removal cycles are performed to partially fill the feature and shape the feature profile, the process may then continue with a final filling operation 213. This operation may be in some aspects similar to the deposition operation 203. The main distinction is that the operation 213 proceeds until the feature is completely closed and it is not followed by an etching operation to open the feature. Returning to FIG. 3, cross-section 361 represents an example of substrate 303 after the final filling operation. In certain embodiments, the feature still has a seam 363, but it is smaller and has a reference point positioned further away from the field region than in a conventionally filled feature, such as the one illustrated in FIG. 1. In certain embodiments, the seam 363 ends at least about 20% from the field region relative to the depth of the feature (i.e., a ratio of $D_{REF}$ to $D_{FET}$ is at least about 20%).

In another embodiment, features are filled by depositing more tungsten inside the features than near the opening. Differential deposition rates may be achieved by inhibiting a surface onto which tungsten-containing materials are being deposited to different levels depending on the position within the feature (e.g., near the opening or inside the feature). Specifically, the surface near the opening may be inhibited more than the surface inside the feature. In a particular embodiment, an inhibitor is introduced into the processing chamber before a deposition operation. The exposed surface of the feature is treated with this inhibitor in a mass-transport limited regime similar to the one described above in the context of etching. However, unlike the etching operation no material is removed from the surface (i.e., no net etch) during inhibiting. For example, at certain process conditions fluorine-based etching of the deposited layer may lead to formation of residues (e.g., containing certain tungsten fluorides) on the surface of the remaining etched layer. These residues may act as an inhibitor in a subsequent deposition operation. Further, at certain process conditions no net removal of materials from the deposited layer may occur, but the deposited layer forms an inhibiting layer that is more prevalent near the opening than inside the feature. Filling the feature using differential deposition rates as may be done in conjunction with or in lieu of the deposition-removal operations described above.

Apparatus

Any suitable chamber may be used to implement this novel method. Examples of deposition apparatuses include various systems, e.g., ALTUS and ALTUS Max, available from Novellus Systems, Inc. of San Jose, Calif., or any of a variety of other commercially available processing systems.

Figure 4A:
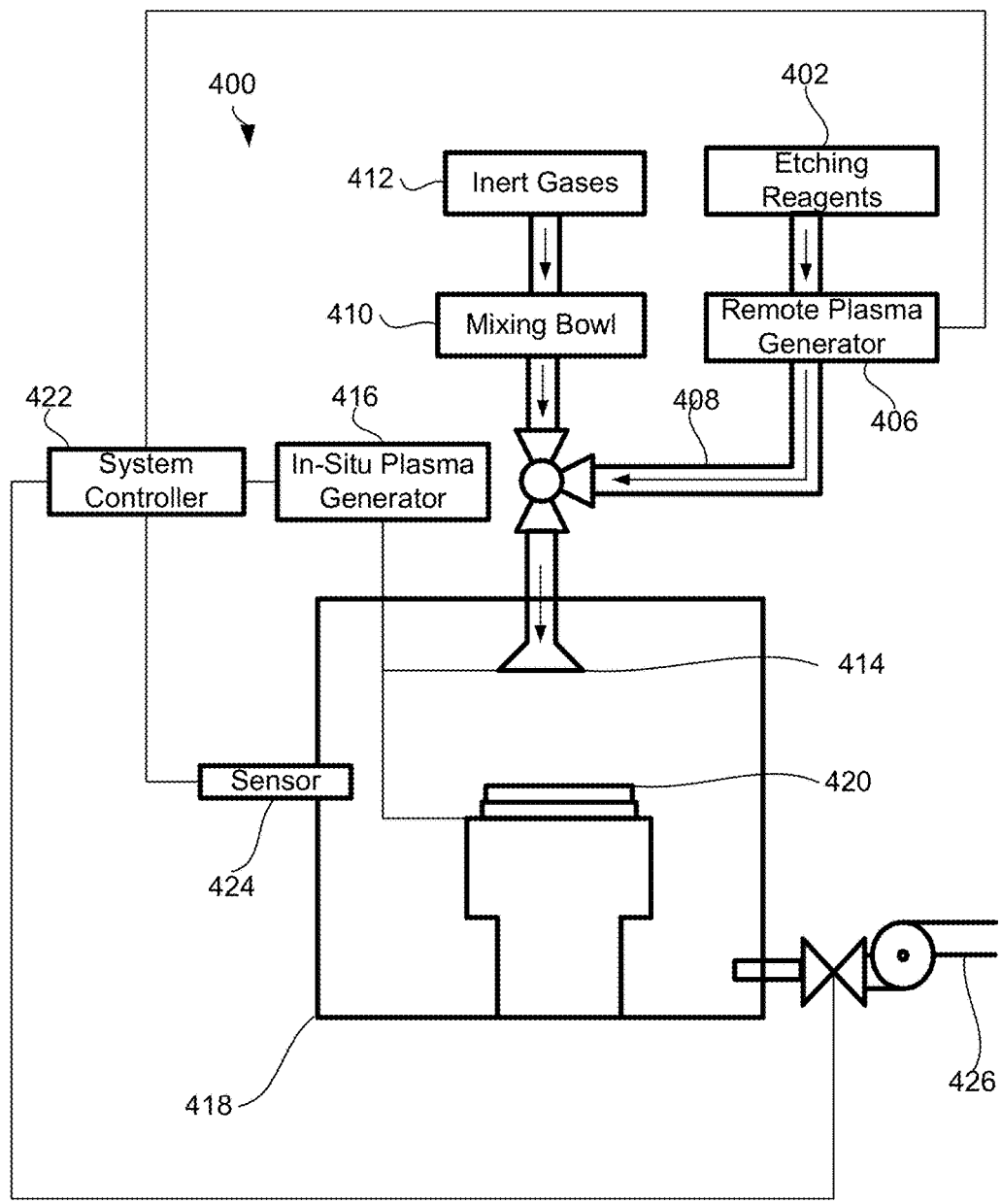
FIG. 4A illustrates a schematic representation of an apparatus, in accordance with certain embodiments, for filling high aspect ratio features.

FIG. 4A illustrates a schematic representation of an apparatus 400 for processing a partially fabricated semiconductor substrate in accordance with certain embodiments. The apparatus 400 includes a chamber 418 with a pedestal 420, a shower head 414, and an in-situ plasma generator 416. The apparatus 400 also includes a system controller 422 to receive input and/or supply control signals to various devices.

The etchant and, in certain embodiments, inert gases, such as argon, helium and others, are supplied to the remote plasma generator 406 from a source 402, which may be a storage tank. Any suitable remote plasma generator may be used for activating the etchant before introducing it into the chamber 418. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used. An RPC unit is typically a self-contained device generating weakly ionized plasma using the supplied etchant. Imbedded into the RPC unit a high power RF generator provides energy to the electrons in the plasma. This energy is then transferred to the neutral etchant molecules leading to temperature in the order of 2000K causing thermal dissociation of these molecules. An RPC unit may dissociate more than 60% of incoming etchant molecules because of its high RF energy and special channel geometry causing the etchant to adsorb most of this energy.

In certain embodiments, an etchant is flown from the remote plasma generator 406 through a connecting line 408 into the chamber 418, where the mixture is distributed through the shower head 414. In other embodiments, an etchant is flown into the chamber 418 directly completely bypassing the remote plasma generator 406 (e.g., the system 400 does not include such generator). Alternatively, the remote plasma generator 406 may be turned off while flowing the etchant into the chamber 418, for example, because activation of the etchant is not needed.

The shower head 414 or the pedestal 420 typically may have an internal plasma generator 416 attached to it. In one example, the generator 416 is a High Frequency (HF) generator capable of providing between about 0 W and 10,000 W at frequencies between about 1 MHz and 100 MHz. In a more specific embodiment, the HF generator may deliver between about 0 W to 5,000 W at about 13.56 MHz. The RF generator 416 may generate in-situ plasma to enhance removal of the initial tungsten layer. In certain embodiments, the RF generator 416 is not used during the removal operations of the process.

The chamber 418 may include a sensor 424 for sensing various process parameters, such as degree of deposition and etching, concentrations, pressure, temperature, and others. The sensor 424 may provide information on chamber conditions during the process to the system controller 422. Examples of the sensor 424 include mass flow controllers, pressure sensors, thermocouples, and others. The sensor 424 may also include an infra-red detector or optical detector to monitor presence of gases in the chamber and control measures.

Deposition and selective removal operations generate various volatile species that are evacuated from the chamber 418. Moreover, processing is performed at certain predetermined pressure levels the chamber 418. Both of these functions are achieved using a vacuum outlet 426, which may be a vacuum pump.

In certain embodiments, a system controller 422 is employed to control process parameters. The system controller 422 typically includes one or more memory devices and one or more processors. The processor may include a CPU or computer, analog and/or digital input/output connections, stepper motor controller boards, etc. Typically there will be a user interface associated with system controller 422. The user interface may include a display screen, graphical software displays of the apparatus and/or process conditions, and user input devices such as pointing devices, keyboards, touch screens, microphones, etc.

In certain embodiments, the system controller 422 controls the substrate temperature, etchant flow rate, power output of the remote plasma generator 406, pressure inside the chamber 418 and other process parameters. The system controller 422 executes system control software including sets of instructions for controlling the timing, mixture of gases, chamber pressure, chamber temperature, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operations of the chamber components used to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, etchant flow rates, etc. These parameters are provided to the user in the form of a recipe, and may be entered utilizing the user interface. Signals for monitoring the process may be provided by analog and/or digital input connections of the system controller 422. The signals for controlling the process are output on the analog and digital output connections of the apparatus 400.

Figure 4B:
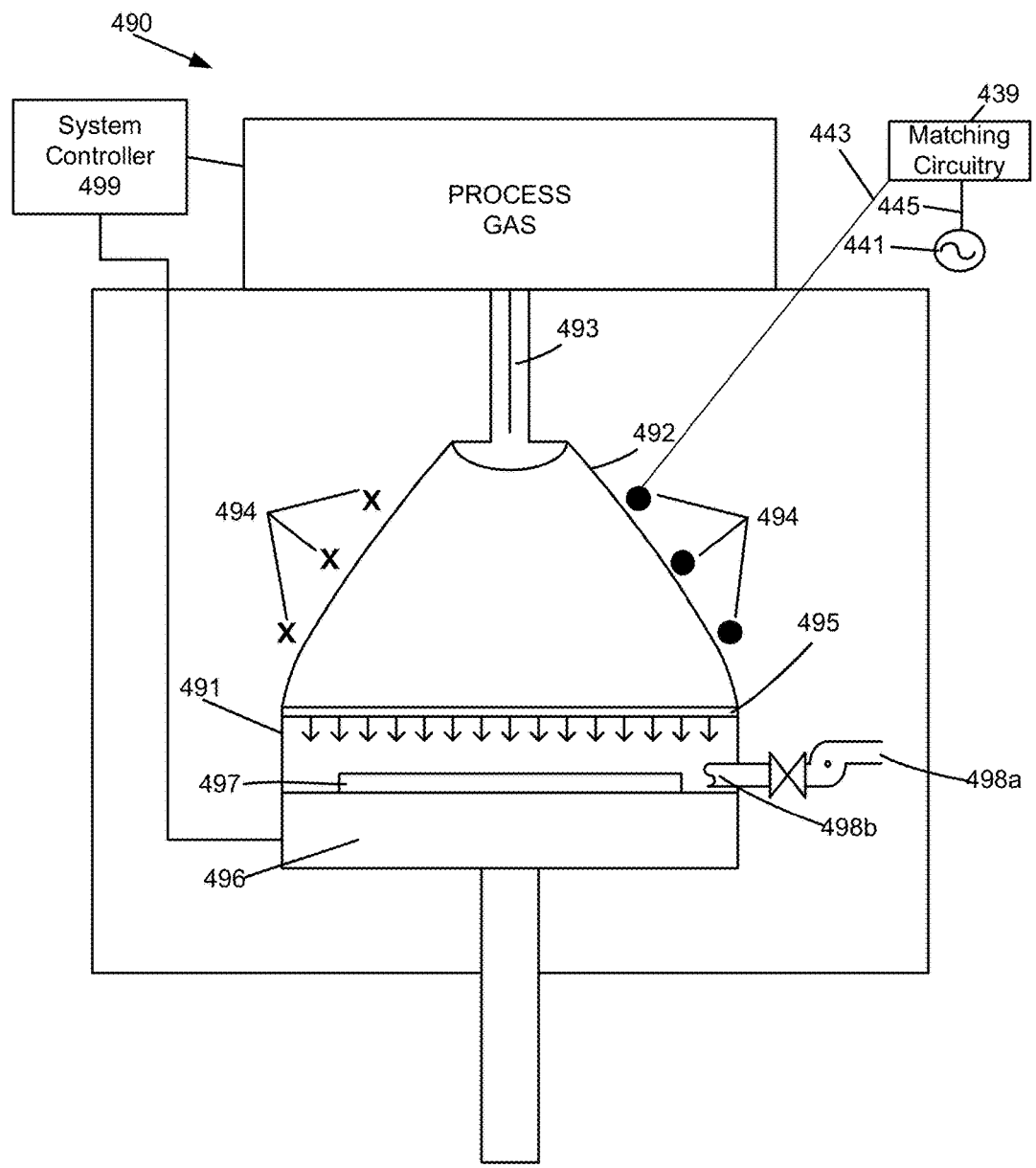
FIG. 4B illustrates a schematic representation of an apparatus, in accordance with certain embodiments, for etching substrates.

FIG. 4B shows another example plasma reactor that may be used to etch metal-containing and/or tungsten materials in accordance with certain disclosed embodiments. FIG. 4B schematically shows a cross-sectional view of an inductively coupled plasma etching apparatus 490 appropriate for implementing certain embodiments herein, an example of which is a ALTUS® Max ExtremeFill™ reactor, produced by Lam Research Corp. of Fremont, Calif. Although ICP reactors are described herein, in some embodiments, it should be understood that capacitively coupled plasma reactors may also be used.

The inductively coupled plasma apparatus 490 includes an overall process chamber structurally defined by chamber walls 491 and a dome 492 for igniting a plasma. The chamber walls 491 may be fabricated from stainless steel or aluminum. Elements for plasma generation include a coil 494, which is positioned around the dome 492 and above the showerhead 495. In some embodiments, a coil is not used in disclosed embodiments. The coil 494 is fabricated from an electrically conductive material and includes at least one complete turn. The example of a coil 494 shown in FIG. 4B includes three turns. The cross-sections of coil 494 are shown with symbols, and coils having an "X" extend rotationally into the page, while coils having a "●" extend rotationally out of the page. Elements for plasma generation also include an RF power supply 441 configured to supply RF power to the coil 494. In general, the RF power supply 441 is connected to matching circuitry 439 through a connection 445. The matching circuitry 439 is connected to the coil 494 through a connection 443. In this manner, the RF power supply 441 is connected to the coil 494. Radio frequency power is supplied from the RF power supply 441 to the coil 494 to cause an RF current to flow through the coil 494. The RF current flowing through the coil 494 generates an electromagnetic field about the coil 494. The electromagnetic field generates an inductively coupled plasma within the dome 492. The physical and chemical interactions of various generated ions and radicals with the wafer 497 etch features on the semiconductor substrate or wafer 497.

Likewise, RF power supply 441 may provide RF power of any suitable frequency. In some embodiments, RF power supply 441 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1 MHz and 2.45 GHz, or between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

The RF power may be programmed to be ramped and/or pulsed during an etching operation performed in accordance with certain embodiments. For example, RF power may be ramped between an ON and OFF state, where the RF power during the OFF state is 0 W and the RF power during the ON state is between about 50 W and about 3000 W. RF power may be pulsed at a frequency between about 1 Hz and about 400 kHz, or between 1 Hz and about 100 KHz, or between about 10 Hz and about 100 kHz, or between about 100 Hz and about 10 kHz. The duty cycle may be between about 1% and about 99% or between about 10% and about 90%. The duration of RF power ON during a pulse may be between about 100 milliseconds and about 10 seconds, or between about 100 milliseconds and about 5 seconds.

Showerhead 495 distributes process gases toward substrate 497. In the embodiment shown in FIG. 4B, the substrate 497 is located beneath showerhead 495 and is shown resting on a pedestal 496. Showerhead 495 may have any suitable shape, and may have any suitable number and arrangement of ports for distributing process gases to substrate 497.

A pedestal 496 is configured to receive and hold a substrate 497 upon which the etching is performed. In some embodiments, pedestal 496 may be raised or lowered to expose substrate 497 to a volume between the substrate 412 and the showerhead 495. It will be appreciated that, in some embodiments, pedestal height may be adjusted programmatically by a suitable computer controller 499.

In another scenario, adjusting a height of pedestal 496 may allow a plasma density to be varied during plasma activation cycles included in the process. At the conclusion of the process phase, pedestal 496 may be lowered during another substrate transfer phase to allow removal of substrate 497 from pedestal 496. In some embodiments, a position of showerhead 495 may be adjusted relative to pedestal 496 to vary a volume between the substrate 497 and the showerhead 495. Further, it will be appreciated that a vertical position of pedestal 496 and/or showerhead 495 may be varied by any suitable mechanism within the scope of the present disclosure. In some embodiments, pedestal 496 may include a rotational axis for rotating an orientation of substrate 497. It will be appreciated that, in some embodiments, one or more of these example adjustments may be performed programmatically by one or more suitable computer controllers 499.

Process gases (e.g. halogen-containing gases, $NF_3$, argon, $WF_6$, nitrogen, etc.) may be flowed into the process chamber through one or more main gas flow inlets 493 positioned in the dome and/or through one or more side gas flow inlets (not shown). Likewise, though not explicitly shown, similar gas flow inlets may be used to supply process gases to a capacitively coupled plasma processing chamber. In some embodiments for a capacitively coupled plasma processing chamber, gas may be injected through a showerhead via the center and/or the edge of the showerhead. A vacuum pump, e.g., a one or two stage mechanical dry pump and/or turbomolecular pump 498a, may be used to draw process gases out of the process chamber 491 and to maintain a pressure within the process chamber 491. A valve-controlled conduit may be used to fluidically connect the vacuum pump to the process chamber 491 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed. Volatile etching and/or deposition byproducts may be removed from the process chamber 491 through port 498b.

In some embodiments, a system controller 499 (which may include one or more physical or logical controllers) controls some or all of the operations of a process chamber 499. The system controller 499 may include one or more memory devices and one or more processors. In some embodiments, the apparatus 490 includes a switching system for controlling flow rates and durations when disclosed embodiments are performed. In some embodiments, the apparatus 490 may have a switching time of up to about 500 ms, or up to about 750 ms. Switching time may depend on the flow chemistry, recipe chosen, reactor architecture, and other factors.

In some implementations, the system controller 499 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 499, which may control various components or subparts of the system or systems. The system controller 499, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 499 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 499, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 530 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 499 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Multi-Station Apparatus

Figure 5A:
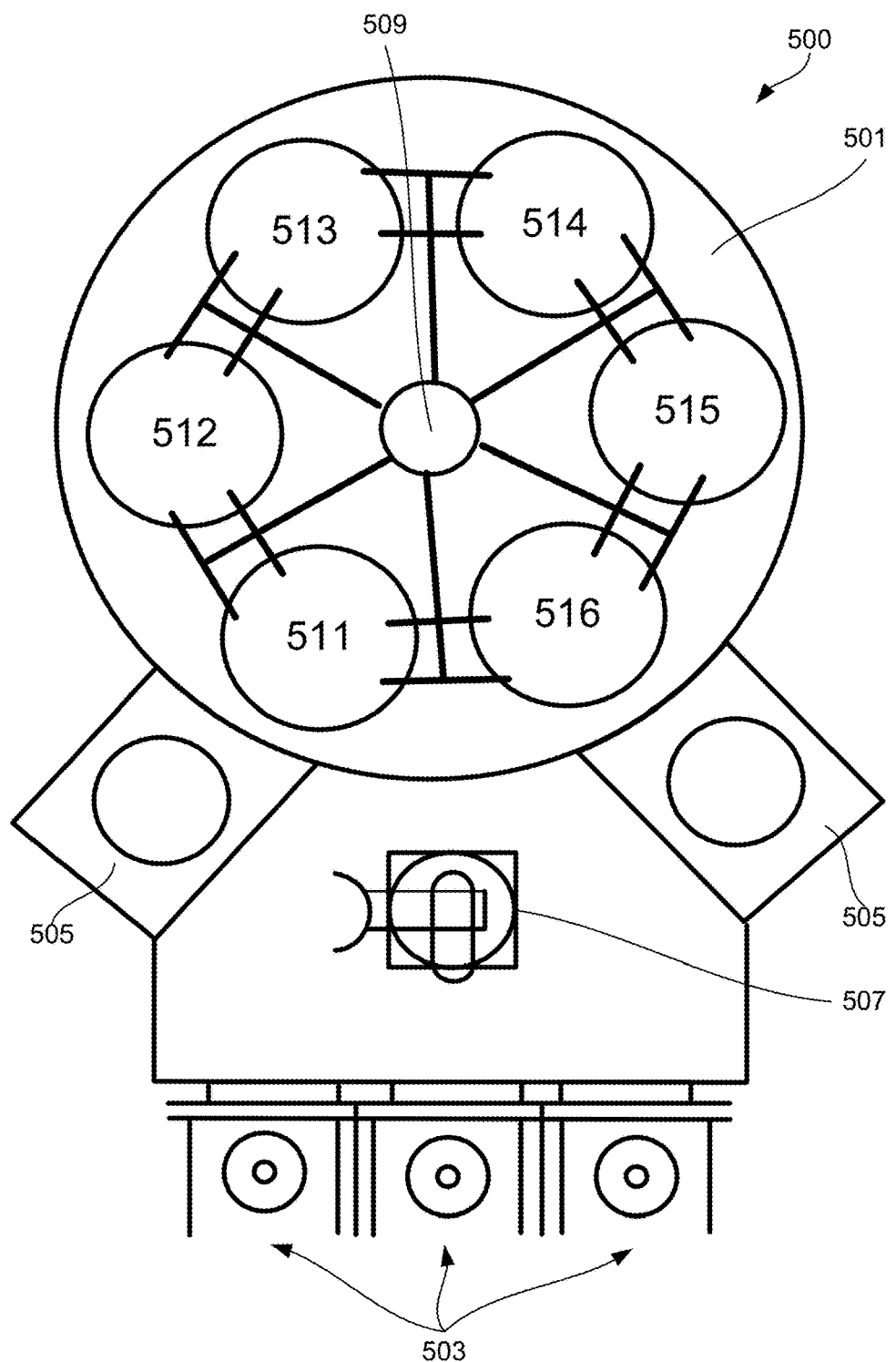
FIG. 5A shows a schematic illustration of a multi-station apparatus, in accordance with certain embodiments, for filling high aspect ratio features.

FIG. 5A shows an example of a multi-station apparatus 500. The apparatus 500 includes a process chamber 501 and one or more cassettes 503 (e.g., Front Opening Unified Ports) for holding substrates to be processed and substrates that have completed processing. The chamber 501 may have a number of stations, for example, two stations, three stations, four stations, five stations, six stations, seven stations, eight stations, ten stations, or any other number of stations. The number of stations in usually determined by a complexity of the processing operations and a number of these operations that can be performed in a shared environment. FIG. 5A illustrates the process chamber 501 that includes six stations, labeled 511 through 516. All stations in the multi-station apparatus 500 with a single process chamber 503 are exposed to the same pressure environment. However, each station may have a designated reactant distribution system and local plasma and heating conditions achieved by a dedicated plasma generator and pedestal, such as the ones illustrated in FIGS. 4A and 4B.

A substrate to be processed is loaded from one of the cassettes 503 through a load-lock 505 into the station 511. An external robot 507 may be used to transfer the substrate from the cassette 503 and into the load-lock 505. In the depicted embodiment, there are two separate load locks 505. These are typically equipped with substrate transferring devices to move substrates from the load-lock 505 (once the pressure is equilibrated to a level corresponding to the internal environment of the process chamber 503) into the station 511 and from the station 516 back into the load-lock 505 for removal from the processing chamber 503. An internal robot 509 is used to transfer substrates among the processing stations 511-516 and support some of the substrates during the process as described below.

In certain embodiments, one or more stations may be reserved for heating the substrate. Such stations may have a heating lamp (not shown) positioned above the substrate and/or a heating pedestal supporting the substrate similar to one illustrated in FIGS. 4A and 4B. For example, a station 511 may receive a substrate from a load-lock and be used to pre-heat the substrate before being further processed. Other stations may be used for filling high aspect ratio features including deposition and selective removal operations.

After the substrate is heated or otherwise processed at the station 511, the substrate is moved successively to the processing stations 512, 513, 514, 515, and 516, which may or may not be arranged sequentially. The multi-station apparatus 500 is configured such that all stations are exposed to the same pressure environment. In so doing, the substrates are transferred from the station 511 to other stations in the chamber 501 without a need for transfer ports, such as load-locks.

The internal robot 509 is used to transfer substrates between stations 511-516. The robot 509 includes a fin with at least one arm for each processing station (shown extending between stations). At the end of the arm adjacent to the processing stations are four fingers that extend from the arm with two fingers on each side. These fingers are used to lift, lower, and position a substrate within the processing stations. For example, in one embodiment, where the multi-station apparatus includes six processing stations, the spindle assembly is a six arm rotational assembly with six arms on one fin. For example, as shown in the drawings the fin of the spindle assembly includes six arms, with each arm having four fingers. A set of four fingers, i.e., two fingers on a first arm and two fingers on an adjacent, second arm, are used to lift, position and lower a substrate from one station to another station. In this manner, the apparatus is provided with four fingers per pedestal, per station and per substrate.

In certain embodiments, one or more stations may be used to fill features with tungsten-containing materials. For example, stations 512 may be used for an initial deposition operation, station 513 may be used for a corresponding selective removal operation. In the embodiments where a deposition-removal cycle is repeated, stations 514 may be used for another deposition operations and station 515 may be used for another partial removal operation. Section 516 may be used for the final filling operation. It should be understood that any configurations of station designations to specific processes (heating, filling, and removal) may be used.

As an alternative to the multi-station apparatus described above, the method may be implemented in a single substrate chamber or a multi-station chamber processing a substrate(s) in a single processing station in batch mode (i.e., non-sequential). In this aspect of the disclosed embodiments, the substrate is loaded into the chamber and positioned on the pedestal of the single processing station (whether it is an apparatus having only one processing station or an apparatus having multi-stations running in batch mode). The substrate may be then heated and the deposition operation may be conducted. The process conditions in the chamber may be then adjusted and the selective removal of the deposited layer is then performed. The process may continue with one or more deposition-removal cycles and with the final filling operation all performed on the same station. Alternatively, a single station apparatus may be first used to perform only one of the operation in the new method (e.g., depositing, selective removal, final filling) on multiple wafers after which the substrates may be returned back to the same station or moved to a different station (e.g., of a different apparatus) to perform one or more of the remaining operations.

Multi-Chamber Apparatus

Figure 5B:
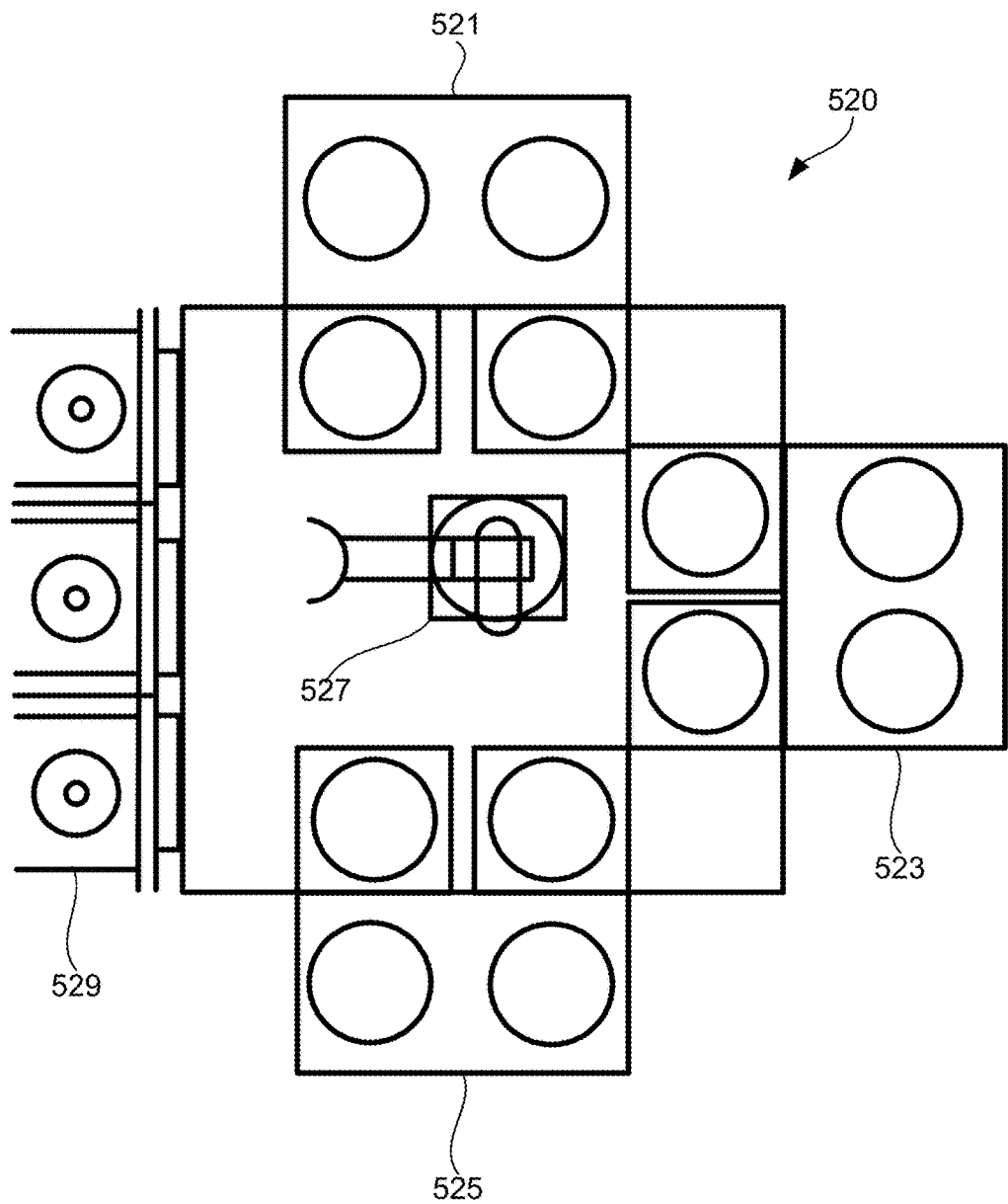
FIG. 5B is a schematic illustration of a multi-chamber apparatus, in accordance with certain embodiments, for filling high aspect ratio features.

FIG. 5B is a schematic illustration of a multi-chamber apparatus 520 that may be used in accordance with certain embodiments. As shown, the apparatus 520 has three separate chambers 521, 523, and 525. Each of these chambers is illustrated with two pedestals. It should be understood that an apparatus may have any number of chambers (e.g., one, two, three, four, five, six, etc.) and each chamber may have any number of chambers (e.g., one, two, three, four, five, six, etc.). Each chamber 521-525 has its own pressure environment, which is not shared between chambers. Each chamber may have one or more corresponding transfer ports (e.g., load-locks). The apparatus may also have a shared substrate handling robot 527 for transferring substrates between the transfer ports one or more cassettes 529.

As noted above, separate chambers may be used for depositing tungsten containing materials and selective removal of these deposited materials in later operations. Separating these two operations into different chambers can help to substantially improve processing speeds by maintaining the same environmental conditions in each chamber. In other words, a chamber does not need to change its environment from conditions used for deposition to conditions used for selective removal and back, which may involve different precursors, different temperatures, pressures, and other process parameters. In certain embodiments, it is faster to transfer partially manufactured semiconductor substrates between two or more different chambers than changing environmental conditions of these chambers.

Patterning Method/Apparatus:

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

A series of experiments were conducted to determine effects of different process conditions on selective removal of the deposited materials and resulting seam. It was found that increasing a substrate temperature and reducing an etchant flow rate can lead to mass-transport limited etching inside the feature resulting in more material etched away near the opening than inside the feature.

In one experiment, different etching conditions and their effects on step coverage were evaluated. Substrates with features that have openings of approximately 250 nanometers in cross-section and an aspect ratio of approximately 10:1 were used. The features were first partially filled with tungsten at about 395° C. substrate temperature, about 200 sccm flow rate of the tungsten fluoride ($WF_6$) in argon and hydrogen environment. Several substrates were then cross-sectioned in order to analyze tungsten distribution within the features. It was found that the layer was slightly thinner inside the features (about 862 Angstroms thick on average) than around the openings (about 639 Angstroms thick on average) leading to step coverage of about 62%.

The remaining substrates were divided into two groups. Substrates in the first group were etched using reference process conditions: a chamber pressure of approximately 8 Torr, a substrate temperature of approximately 350° C., a flow rate of nitrogen tri-fluoride (NF3) of approximately 2,000 sccm, and etching duration of approximately 4 seconds. Several substrates from this group were cross-sectioned after the etching to further analyze tungsten distribution within the features. It was determined that the opening thickness (a thickness of the tungsten layer near the opening) was on average about 497 Angstroms, while the inside thickness was on average about 464 Angstroms, for a step coverage of about 107%.

The second group of wafers was etched using different ("improved") process conditions. These new conditions were believed to push the etching inside the feature into the mass-transport limited regime and, thus, improve the step coverage even more. The substrate temperature was increased to approximately 395° C., while the etchant flow rate was reduced to approximately 400 sccm. The etching was performed in a chamber maintained at about 2 Torr for approximately 12 seconds. The remaining etched layer was significantly thicker inside the features (about 555 Angstroms thick on average) than near the openings (about 344 Angstroms thick on average). The calculated step coverage is about 161%.

Figure 6A:
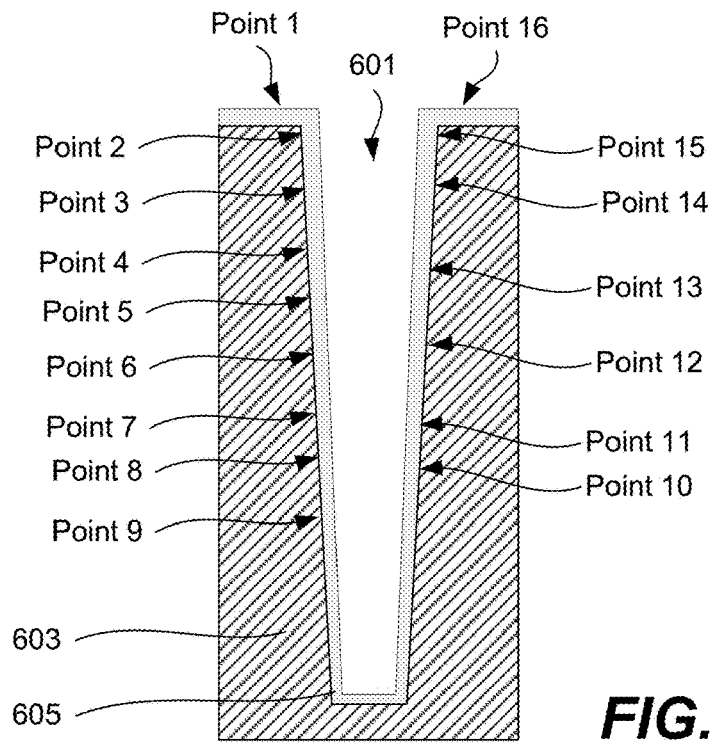
FIG. 6A illustrates a schematic representation of a feature provided in a partially manufactured semiconductor substrate with a tungsten-containing layer deposited in the feature and specifies different points of measurements of the layer thickness.
Figure 6B:
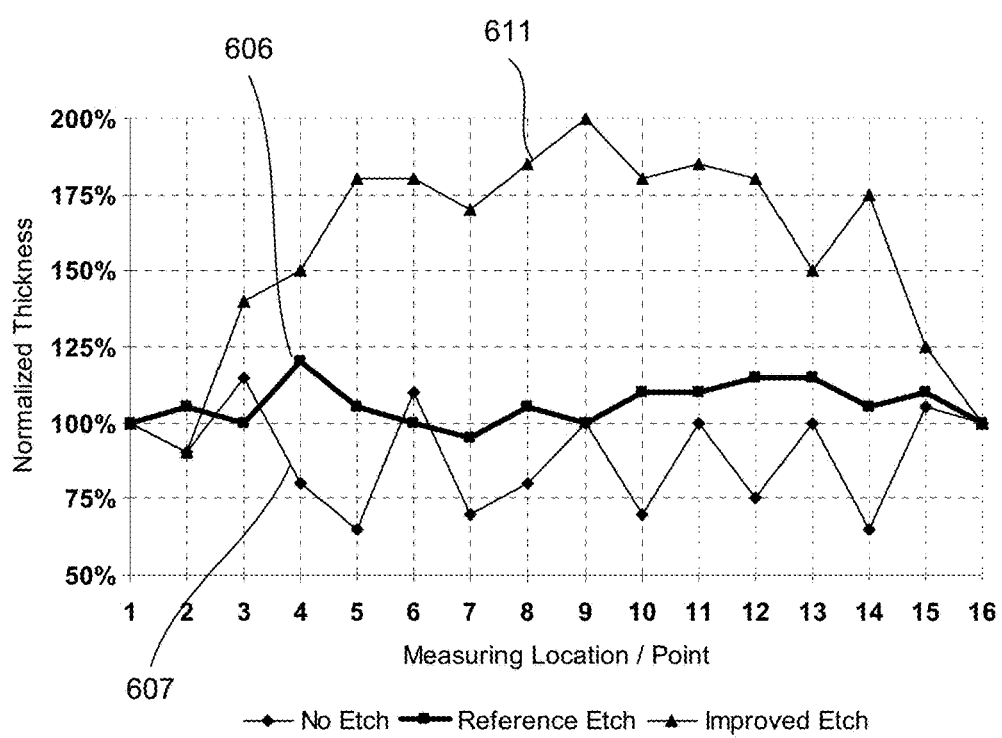
FIG. 6B illustrates a graph of the thickness distribution of the tungsten-containing layer shown in FIG. 6A before etching and after etching for two different process conditions.

FIG. 6A illustrates a schematic representation of a feature 601 provided in a partially manufactured semiconductor substrate 603 with a tungsten-containing layer 605 formed with the feature 601 similar to the one used in the above experiment. The figure also specifies different points of measurements of the layer thickness. FIG. 6B illustrates a graph of the thickness distribution of the tungsten-containing layer for the experiment described above before etching and after etching for two different process conditions. The horizontal axis of this graph corresponds to the measuring points illustrated in FIG. 6A. Thickness values provided in the graph are normalized to the respective values on the field region (points 1 and 16). The bottom thin line 607 represents thickness distribution within the feature prior to any etching. This line indicates that the layer is generally slightly thinner inside the feature than near the opening after deposition. The middle thick line 609 represents thickness distribution for the substrates etched with the reference etching conditions. This distribution indicates slightly greater step coverage than the one represented by the line 607. Finally, the top thin line 611 represents distribution of tungsten that was etched using the "improved" conditions. It reveals substantially improved step coverage. The thickness at the lowest (deepest) measured points (points 8, 9, and 10, which were approximately 30-40% of the feature's depth from the feature's bottom), is almost twice greater than the thickness near the field region (points 1, 2, 15, and 16).

Experiment 2

An experiment was conducted for filling features on a substrate. One substrate was exposed to continuous plasma during deposition by depositing tungsten using a tungsten-containing precursor, exposing the substrate to continuous plasma and $NF_3$ to selectively remove tungsten at the tops of the feature, and filling the rest of the feature with tungsten. A second substrate was subject to deposition by depositing tungsten using a tungsten-containing precursor, exposing the substrate to pulsed plasma and $NF_3$ at a pulsing frequency of 10 KHz with a 30% duty cycle, and filling the rest of the feature with tungsten.

The nucleation delay for the first substrate was about 40 seconds, while there was a 0 second delay for the second substrate. The amount of remnant nitrogen and fluorine after the exposure to the plasma was determined for both substrates, and the etch thickness nonuniformity from the plasma exposure was also determined. The gap fill amount was observed by image. The results are shown in Table 1 below.

TABLE 1

| | Continuous vs. Pulsed Plasma | |
|---|---|---|
| Property | First Substrate (Continuous Plasma) | Second Substrate (Pulsed Plasma) |
| Deposition Delay | ~40 seconds | 0 seconds |
| N Remnant (Avg N/W) | 16% | 8% |
| F Remnant (Avg F/W) | 6% | 4% |
| Gap Fill | Good | Moderate |

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the disclosed embodiments. Accordingly, the present embodiments are to be considered as illustrative and not restrictive, and the disclosed embodiments are not to be limited to the details given herein.

What is claimed is:

1. An apparatus comprising:
a process chamber comprising a showerhead and a pedestal;
one or more gas inlets into the process chamber and associated flow-control hardware;
a radio frequency (RF) plasma generator configured to generate a capacitively coupled or inductively coupled plasma in the process chamber; and
a controller having at least one processor and a memory, wherein the at least one processer and the memory are communicatively connected with one another,
the at least one processor is at least operatively connected with the flow-control hardware and RF plasma generator, and
the memory stores computer-executable instructions for:
causing introduction of a fluorine- and nitrogen-containing gas to the process chamber,
causing generation of a plasma in the process chamber, and causing pulsing of the RF plasma generator between an ON state and an OFF state, wherein plasma power during the OFF state is 0 W and the plasma power during the ON state is between about 50 W and about 3000 W.

2. The apparatus of claim 1, wherein flow of the fluorine- and nitrogen-containing gas is pulsed.

3. The apparatus of claim 1, wherein the radio frequency generator is a remote plasma generator.

4. The apparatus of claim 1, wherein the memory further stores computer-executable instructions for causing pulse frequency of the pulsing of the RF plasma generator to be between about 1 Hz and about 400 kHz.

5. The apparatus of claim 1, wherein the memory further stores computer-executable instructions for causing duty cycle of the pulsing of the RF plasma generator to be between about 10% and about 90%.

6. A method comprising:
providing a substrate having a partially filled feature partially filled with a metal to a process chamber having a remote radio frequency plasma source for generating a capacitively coupled or inductively coupled plasma;
exposing the partially filled feature to a fluorine- and nitrogen-based plasma generated by the remote radio frequency plasma source to remove a portion of the metal; and
pulsing the remote radio frequency plasma source for generating the capacitively coupled or inductively coupled plasma during the exposing of the partially filled feature to the fluorine- and nitrogen-based plasma.

7. The method of claim 6, wherein the metal is tungsten.

8. The method of claim 6, wherein the remote radio frequency plasma source is pulsed between an ON state and an OFF state, wherein plasma power during the OFF state is 0 W and the plasma power during the ON state is between about 50 W and about 3000 W.

9. The method of claim 6, wherein the remote radio frequency plasma source is pulsed at a frequency between about 1 Hz and about 400 kHz.

10. The method of claim 6, wherein the remote radio frequency plasma source is pulsed using a duty cycle between about 10% and about 90%.

11. The method of claim 6, wherein the remote radio frequency plasma source is pulsed between an ON state and an OFF state, and wherein the capacitively coupled or inductively coupled plasma is in the ON state for a duration between about 100 milliseconds and about 10 seconds in each pulse.

12. The method of claim 6, wherein exposing the partially filled feature to the fluorine- and nitrogen-based plasma comprises flowing a fluorine- and nitrogen-containing gas and igniting the fluorine- and nitrogen-based plasma using the remote radio frequency plasma source.

13. The method of claim 6, further comprising, after removing the portion of the metal, exposing the substrate to a metal-containing precursor to deposit additional metal in the partially filled feature.

14. A method comprising:
providing a substrate having a feature partially filled with tungsten to a process chamber having a remote radio frequency plasma source for generating a capacitively coupled or inductively coupled plasma;
introducing a fluorine- and nitrogen-containing gas to the process chamber;
pulsing flow of the fluorine- and nitrogen-containing gas; and
igniting an inductively coupled or capacitively coupled plasma in the process chamber to generate a fluorine- and nitrogen-based plasma to etch a portion of the tungsten; and
pulsing the remote radio frequency plasma source for generating the capacitively coupled or inductively coupled plasma during the igniting of the inductively coupled or capacitively coupled plasma.

15. The method of claim 14, wherein the fluorine- and nitrogen-containing gas is nitrogen trifluoride.

16. The method of claim 14, wherein the inductively coupled or capacitively coupled plasma is pulsed between an ON state and an OFF state, wherein plasma power during the OFF state is 0 W and the plasma power during the ON state is between about 50 W and about 3000 W.

17. The method of claim 14, wherein the inductively coupled or capacitively coupled plasma is pulsed at a frequency between about 1 Hz and about 400 kHz.

* * * * *

UNITED STATES PATENT AND TRADEMARK OFFICE
CERTIFICATE OF CORRECTION

PATENT NO. : 10,395,944 B2
APPLICATION NO. : 15/968605
DATED : August 27, 2019
INVENTOR(S) : Fung et al.

Page 1 of 1

It is certified that error appears in the above-identified patent and that said Letters Patent is hereby corrected as shown below:

On the Title Page

Column 2, Item (74), change "Weaver Austin Villenueve & Sampson LLP," to --Weaver Austin Villeneuve & Sampson LLP,--.

In the Claims

In Claim 3, Column 31, Line 8 should read --"The apparatus of claim 1, wherein the radio frequency plasma generator is a remote plasma generator."--.

Signed and Sealed this
Twenty-first Day of January, 2020

Andrei Iancu
*Director of the United States Patent and Trademark Office*